(12) United States Patent
Chehade et al.

(10) Patent No.: US 11,612,077 B2
(45) Date of Patent: Mar. 21, 2023

(54) UNINTERRUPTIBLE POWER SUPPLY HAVING A LIQUID COOLING DEVICE

(71) Applicant: OVH, Roubaix (FR)

(72) Inventors: Ali Chehade, Moncheaux (FR); Hadrien Bauduin, Villeneuve d'Ascq (FR); Gregory Francis Louis Bauchart, Wattrelos (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/308,181

(22) Filed: May 5, 2021

(65) Prior Publication Data

US 2021/0378137 A1 Dec. 2, 2021

(30) Foreign Application Priority Data

May 29, 2020 (EP) .................................... 20315286

(51) Int. Cl.
*H05K 7/20* (2006.01)
*H05K 5/02* (2006.01)

(52) U.S. Cl.
CPC ....... *H05K 7/20172* (2013.01); *H05K 5/0217* (2013.01); *H05K 7/209* (2013.01);
(Continued)

(58) Field of Classification Search
CPC ............. H05K 7/20172; H05K 7/0217; H05K 7/20272; H05K 7/20409; H05K 7/209;
(Continued)

(56) References Cited

U.S. PATENT DOCUMENTS

| 5,801,937 A | 9/1998 | Gold et al. |
| 5,923,533 A | 7/1999 | Olson |

(Continued)

FOREIGN PATENT DOCUMENTS

| CN | 203553991 U | 4/2014 |
| CN | 205453279 U | 8/2016 |

(Continued)

OTHER PUBLICATIONS

Li, Yong, "A Movable Cabinet Level Server System of Heat Sink and Thermal Management Method", Nov. 24, 2017, Entire Document translation of CN 107396599 (Year: 2017).*

(Continued)

*Primary Examiner* — Stephen S Sul
(74) *Attorney, Agent, or Firm* — BCF LLP

(57) ABSTRACT

An uninterruptible power supply (UPS) includes: a housing defining an interior space; a door operatively connected to the housing, the door being configured to be selectively opened and closed for accessing the interior space of the housing; san electrical system enclosed within the housing; at least one liquid cooling device mounted to a target component of the UPS disposed within the housing for cooling thereof, the at least one liquid cooling device defining a fluid conduit for circulating fluid therethrough; and a pumping module including at least one pump fluidly connected to the at least one liquid cooling device for circulating fluid therethrough, each of the at least one pump and the fluid conduit of the at least one liquid cooling device defining in part a liquid cooling circuit, the pumping module being mounted to the door and disposed on an exterior side thereof.

17 Claims, 22 Drawing Sheets

(52) U.S. Cl.
CPC ..... *H05K 7/20272* (2013.01); *H05K 7/20409* (2013.01); *H05K 7/20909* (2013.01); *H05K 7/20927* (2013.01)

(58) Field of Classification Search
CPC .......... H05K 7/20909; H05K 7/20927; H05K 5/0217; H05K 7/20645; H02J 9/06
See application file for complete search history.

(56) References Cited

U.S. PATENT DOCUMENTS

| | | | |
|---|---|---|---|
| 6,351,381 B1 * | 2/2002 | Bilski | F28F 1/32 361/689 |
| 6,841,276 B2 | 1/2005 | Colborn | |
| 7,298,618 B2 | 11/2007 | Campbell et al. | |
| 7,400,504 B2 | 7/2008 | Campbell et al. | |
| 7,641,101 B2 | 1/2010 | Campbell et al. | |
| 7,830,664 B2 | 11/2010 | Campbell et al. | |
| 7,843,695 B2 | 11/2010 | Yang et al. | |
| 8,302,671 B2 | 11/2012 | Sauer et al. | |
| 8,335,083 B2 | 12/2012 | Yang et al. | |
| 8,427,832 B2 | 4/2013 | Dede et al. | |
| 8,925,623 B2 | 1/2015 | Sauer et al. | |
| 9,345,169 B1 | 5/2016 | Campbell et al. | |
| 9,504,184 B2 | 11/2016 | Krug et al. | |
| 9,504,186 B2 | 11/2016 | Dixler et al. | |
| 10,531,594 B2 | 1/2020 | Reeves et al. | |
| 10,582,835 B2 * | 3/2020 | Surti | A61B 1/00174 |
| 2001/0042616 A1 * | 11/2001 | Baer | H05K 7/20736 165/104.34 |
| 2004/0050231 A1 * | 3/2004 | Chu | H05K 7/2079 30/317 |
| 2007/0193291 A1 * | 8/2007 | Reddin | B60H 1/00357 62/239 |
| 2008/0018212 A1 * | 1/2008 | Spearing | H05K 7/20645 16/386 |
| 2009/0216381 A1 * | 8/2009 | Gooch | A62C 3/16 700/277 |
| 2010/0085708 A1 * | 4/2010 | Martin | H05K 7/20927 361/699 |
| 2010/0236772 A1 * | 9/2010 | Novotny | H05K 7/20836 165/287 |
| 2011/0014501 A1 * | 1/2011 | Scheucher | B60L 58/13 429/7 |
| 2012/0287577 A1 | 11/2012 | Sevaekivi et al. | |
| 2013/0049473 A1 | 2/2013 | Brech et al. | |
| 2013/0050931 A1 | 2/2013 | Heiland et al. | |
| 2013/0091874 A1 * | 4/2013 | Sillato | H05K 7/20836 62/226 |
| 2013/0105116 A1 | 5/2013 | Campbell et al. | |
| 2014/0078672 A1 | 3/2014 | Brunschwiler et al. | |
| 2014/0133099 A1 * | 5/2014 | Campbell | H05K 7/20818 361/698 |
| 2015/0059360 A1 * | 3/2015 | Lin | F25B 21/02 165/104.31 |
| 2015/0062819 A1 * | 3/2015 | Oughton, Jr. | H01L 23/473 361/700 |
| 2015/0156914 A1 | 6/2015 | Kwak et al. | |
| 2016/0338222 A1 | 11/2016 | Reeves et al. | |
| 2017/0013746 A1 * | 1/2017 | Campbell | H05K 7/20736 |
| 2019/0379269 A1 | 12/2019 | Huntgeburth et al. | |
| 2020/0003497 A1 * | 1/2020 | Aston | B22F 12/38 |
| 2021/0098946 A1 * | 4/2021 | Davis | H01L 23/053 |
| 2021/0280457 A1 * | 9/2021 | Brun | H01L 23/053 |
| 2021/0407888 A1 * | 12/2021 | Elsherbini | B01F 33/301 |
| 2022/0046822 A1 * | 2/2022 | Gao | H05K 7/1488 |

FOREIGN PATENT DOCUMENTS

| | | | | |
|---|---|---|---|---|
| CN | 205453474 U | 8/2016 | | |
| CN | 206517734 U | 9/2017 | | |
| CN | 206533672 U | 9/2017 | | |
| CN | 206533676 U | 9/2017 | | |
| CN | 107396599 A | 11/2017 | | |
| CN | 107452699 A | 12/2017 | | |
| CN | 207009606 U | 2/2018 | | |
| CN | 207491444 U | 6/2018 | | |
| CN | 109156995 A | 1/2019 | | |
| CN | 208509501 U | 2/2019 | | |
| CN | 209001666 U | 6/2019 | | |
| CN | 110062561 A | 7/2019 | | |
| CN | 209169763 U | 7/2019 | | |
| CN | 209329773 U | 8/2019 | | |
| CN | 209561980 U | 10/2019 | | |
| CN | 209983002 U | 1/2020 | | |
| CN | 111159632 A * | 5/2020 | ............. | H02K 47/04 |
| EP | 1001671 B1 | 1/2005 | | |
| WO | 2016150293 A1 | 9/2016 | | |
| WO | WO-2018158115 A1 * | 9/2018 | ............. | H02K 47/04 |

OTHER PUBLICATIONS

Huntgeburth Joachim; Benke Thomas; Ueffing Norbert, "Online UPS System With Combined Air and Water Cooling", Sep. 7, 2018, Piller Group GMBH, Entire Document (Translation of WO 2018158115). (Year: 2018).*

Dong Kaijun; Shao Zhenhua; Su Lin, "Data center cooling energy efficiency and economy calculation method", May 15, 2020, Guangzhou Inst Energy Conversion CAS, Entire Document (Translation of CN 111159632). (Year: 2020).*

Notice of Allowance with regard to the counterpart U.S. Appl. No. 17/308,257 dated Jul. 11, 2022.

Extended European Search Report with regard to the European Patent Application No. EP 20315286.3 completed Sep. 30, 2020.

English Abstract for CN209169763 retrieved on Espacent on May 4, 2021.

English Abstract for CN207009606 retrieved on Espacent on May 4, 2021.

English Abstract for CN209561980 retrieved on Espacent on May 4, 2021.

English Abstract for CN207491444 retrieved on Espacent on May 4, 2021.

English Abstract for CN107396599 retrieved on Espacent on May 4, 2021.

English Abstract for CN109156995 retrieved on Espacent on May 4, 2021.

English Abstract for CN110062561 retrieved on Espacent on May 4, 2021.

English Abstract for EP1001671 retrieved on Espacent on May 4, 2021.

English Abstract for CN209329773 retrieved on Espacent on May 4, 2021.

English Abstract for CN208509501 retrieved on Espacent on May 4, 2021.

English Abstract for CN206533676 retrieved on Espacent on May 4, 2021.

English Abstract for CN209983002 retrieved on Espacent on May 4, 2021.

English Abstract for CN206533672 retrieved on Espacent on May 4, 2021.

English Abstract for CN203553991 retrieved on Espacent on May 4, 2021.

English Abstract for CN205453474 retrieved on Espacent on May 4, 2021.

English Abstract for CN205453279 retrieved on Espacent on May 4, 2021.

English Abstract for CN206517734 retrieved on Espacent on May 4, 2021.

English Abstract for CN209001666 retrieved on Espacent on May 4, 2021.

Extended European Search Report with regard to the European Patent Application No. EP 20315287.1 completed Nov. 12, 2020.

English Abstract for CN107452699 retrieved on Espacenet on May 5, 2021.

* cited by examiner

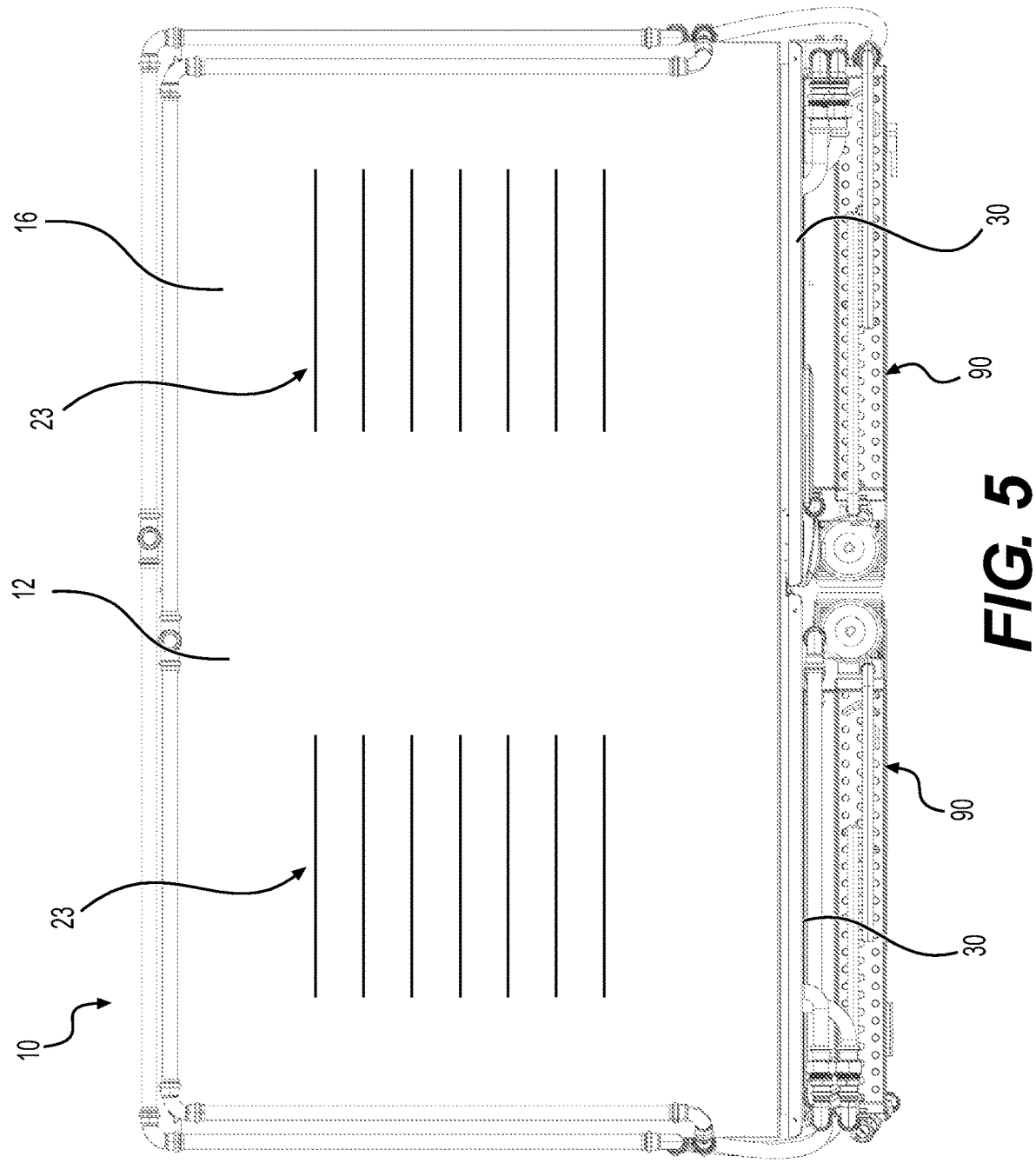

UNINTERRUPTIBLE POWER SUPPLY HAVING A LIQUID COOLING DEVICE

CROSS-REFERENCE

The present application claims priority from European Patent Application No. 20315286.3, entitled "Uninterruptible Power Supply Having a Liquid Cooling Device," filed on May 29, 2020, the entirety of which is incorporated herein by reference.

FIELD OF TECHNOLOGY

The present technology relates to uninterruptible power supplies, and in particular to those used in data centers.

BACKGROUND

Uninterruptible power supplies (UPSs) are used to provide backup power to a target load in case a main electrical supply thereof should fail or otherwise be subject to a change that could negatively affect the target load. In particular, if the main electrical supply to the target load is interrupted or otherwise affected, a UPS connected to the target load would immediately take over supplying electricity without any interruption to the system. For that reason, UPSs are an important component in data centers, namely to ensure continuous operation of servers and other equipment housed in a data center (e.g., cooling equipment).

While UPSs are undoubtedly useful, they also typically generate significant amounts of heat which must be taken into consideration in their design and in their environmental surroundings (e.g., their placement within a data center). Many heat management solutions exist for UPSs, including for instance providing dedicated air cooling equipment (e.g., an air handling unit) between two UPSs to allow them to aspirate air discharged by the air cooling equipment, or for instance providing separator walls for each UPS to ensure that cool air is aspirated into the UPS. However, these solutions can require significant resources to implement, and moreover can occupy considerable space within the data center. For instance, in some cases, raised floors and/or false ceilings may be implemented to provide a route for heated or cooled air to circulate therethrough.

There is therefore a desire for a UPS which can alleviate at least some of these drawbacks.

SUMMARY

It is an object of the present technology to ameliorate at least some of the inconveniences present in the prior art.

According to one aspect of the present technology, there is provided an uninterruptible power supply (UPS). The UPS includes: a housing defining an interior space; a door operatively connected to the housing, the door being configured to be selectively opened and closed for accessing the interior space of the housing; an electrical system enclosed within the housing; at least one liquid cooling device mounted to a target component of the UPS disposed within the housing for cooling thereof, the at least one liquid cooling device defining a fluid conduit for circulating fluid therethrough; and a pumping module including at least one pump fluidly connected to the at least one liquid cooling device for circulating fluid therethrough, each of the at least one pump and the fluid conduit of the at least one liquid cooling device defining in part a liquid cooling circuit, the pumping module being mounted to the door and disposed on an exterior side thereof.

In some embodiments, the door defines at least one opening. The UPS also includes an air-to-liquid heat exchanger configured for cooling air flowing therethrough, the air-to-liquid heat exchanger being mounted to the door on the exterior side thereof and being at least partially aligned with the at least one opening. The air-to-liquid heat exchanger includes: a cooling coil for circulating fluid therethrough; and a plurality of fins in thermal contact with the cooling coil. The UPS also includes at least one fan contained within the housing when the door is closed, the at least one fan being configured to force air to flow through the at least one opening of the door and through the air-to-liquid heat exchanger.

In some embodiments, the air-to-liquid heat exchanger is disposed vertically higher than the pumping module.

In some embodiments, the at least one fan is mounted to the door on an interior side thereof.

In some embodiments, the housing includes a top wall defining a top opening for air to be pulled into the interior space of the housing through the top opening.

In some embodiments, the housing includes a bottom wall defining a bottom opening for air to be pulled into the interior space of the housing through the bottom opening.

In some embodiments, the pumping module also includes at least one plate heat exchanger defining part of the liquid cooling circuit, the at least one plate heat exchanger being fluidly connected to the at least one pump and to the at least one liquid cooling device. Fluid cooled in the liquid cooling circuit by the at least one plate heat exchanger is routed to the at least one liquid cooling device.

In some embodiments, the door defines at least one opening. The UPS also includes an air-to-liquid heat exchanger configured for cooling air flowing therethrough, the air-to-liquid heat exchanger being mounted to the door on the exterior side thereof and being at least partially aligned with the at least one opening. The air-to-liquid heat exchanger includes: a cooling coil for circulating fluid therethrough, the cooling coil defining part of an air cooling circuit; and a plurality of fins in thermal contact with the cooling coil. The pumping module also includes at least one plate heat exchanger defining part of the liquid cooling circuit and part of the air cooling circuit so that heat can be transferred between fluid in the liquid cooling circuit and fluid in the air cooling circuit at the at least one plate heat exchanger.

In some embodiments, the cooling coil of the air-to-liquid heat exchanger is configured to be connected to an external cooling equipment such that the air cooling circuit is defined at least in part externally of the UPS. The liquid cooling circuit is defined entirely locally at the UPS.

In some embodiments, the door is a first door; the air-to-liquid heat exchanger is a first air-to-liquid heat exchanger; the at least one fan is at least one first fan; and the pumping module is a first pumping module. The UPS also includes: a second door operatively connected to the housing, the second door being configured to be selectively opened and closed for accessing the interior space of the housing, the second door defining at least one opening; a second pumping module including at least one pump fluidly connected to the at least one liquid cooling device for circulating fluid through the liquid cooling circuit, the second pumping module being mounted to the second door and disposed on an exterior side thereof; and a second air-to-liquid heat exchanger mounted to the second door on the exterior side thereof, the second air-to-liquid heat being configured for cooling air flowing therethrough, the second air-to-liquid heat exchanger being at least partially aligned with the at least one opening of the second door. The second air-to-liquid heat exchanger includes: a cooling coil for circulating fluid therethrough; and a plurality of fins in thermal contact with the cooling coil of the second air-to-liquid heat exchanger. The UPS also includes at least one second fan contained within the housing when the second door is closed, the at least one second fan being configured to force air to flow through the at least one opening of the second door and through the second air-to-liquid heat exchanger.

In some embodiments, the electrical system includes: a rectifier module configured to be electrically connected to at least one battery for charging thereof; and an inverter module electrically connected to the at least one battery for supplying electrical power from the at least one battery to a target load. The target component is a component of the electrical system of the UPS.

In some embodiments, at least one of the inverter module and the rectifier module includes a plurality of semiconductors; and the at least one liquid cooling device is mounted to at least one of the semiconductors.

According to another aspect of the present technology, there is provided a door assembly for an uninterruptible power supply (UPS), the UPS including a housing defining an interior space. The door assembly includes: a door having an interior side and an exterior side, the door being configured to be operatively connected to the housing of the UPS such that the door can be selectively opened and closed for accessing the interior space of the housing; and a pumping module including at least one pump configured to be fluidly connected to at least one liquid cooling device of the UPS disposed in the interior space for circulating fluid therethrough, the pumping module being mounted to the door and disposed on the exterior side thereof.

In some embodiments, the door defines at least one opening. The door assembly also includes an air-to-liquid heat exchanger configured for cooling air flowing therethrough, the air-to-liquid heat exchanger being mounted to the door on the exterior side thereof and being at least partially aligned with the at least one opening. The air-to-liquid heat exchanger includes: a cooling coil for circulating fluid therethrough; and a plurality of fins in thermal contact with the cooling coil.

In some embodiments, the door assembly also includes at least one fan mounted to the door on the interior side thereof, the at least one fan being configured to force air to flow through the at least one opening of the door and through the air-to-liquid heat exchanger.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 5 is a top plan view of the UPS of FIG. 1;

DETAILED DESCRIPTION

FIGS. 1 to 5 show an uninterruptible power supply (UPS) 10 in accordance with an embodiment of the present technology. In use, the UPS 10 is electrically connected to a target load 13 (see FIG. 6) so as to provide backup electrical power thereto to ensure continuous operation of the target load 13 in case a primary power source 17 (e.g., an electrical network) that provides electrical power for powering the target load 13 fails or otherwise is subject to discontinuous performance (e.g., spikes in voltage). The UPS 10 can be used in different types of applications and therefore the target load 13 can constitute different types of equipment depending on the application. For instance, in this particular example, the UPS 10 is used in a data center 100 for providing backup power to data center equipment housed within the data center 100. Thus, in this example, the target load 13 is data center equipment which can include but is not limited to servers, network equipment, cooling equipment, etc.

As will be described in greater detail below, the UPS 10 is cooled at least in part by liquid cooling devices that are fed and discharged via at least one pumping module of the UPS 10. This can help in cooling the UPS 10 more efficiently while maintaining safe operating conditions thereof. Moreover, as will be discussed further below, it can also provide more freedom in the configuration of the data center 100 as fewer design restrictions may apply to the UPS 10 than a conventional UPS.

Figure 1:
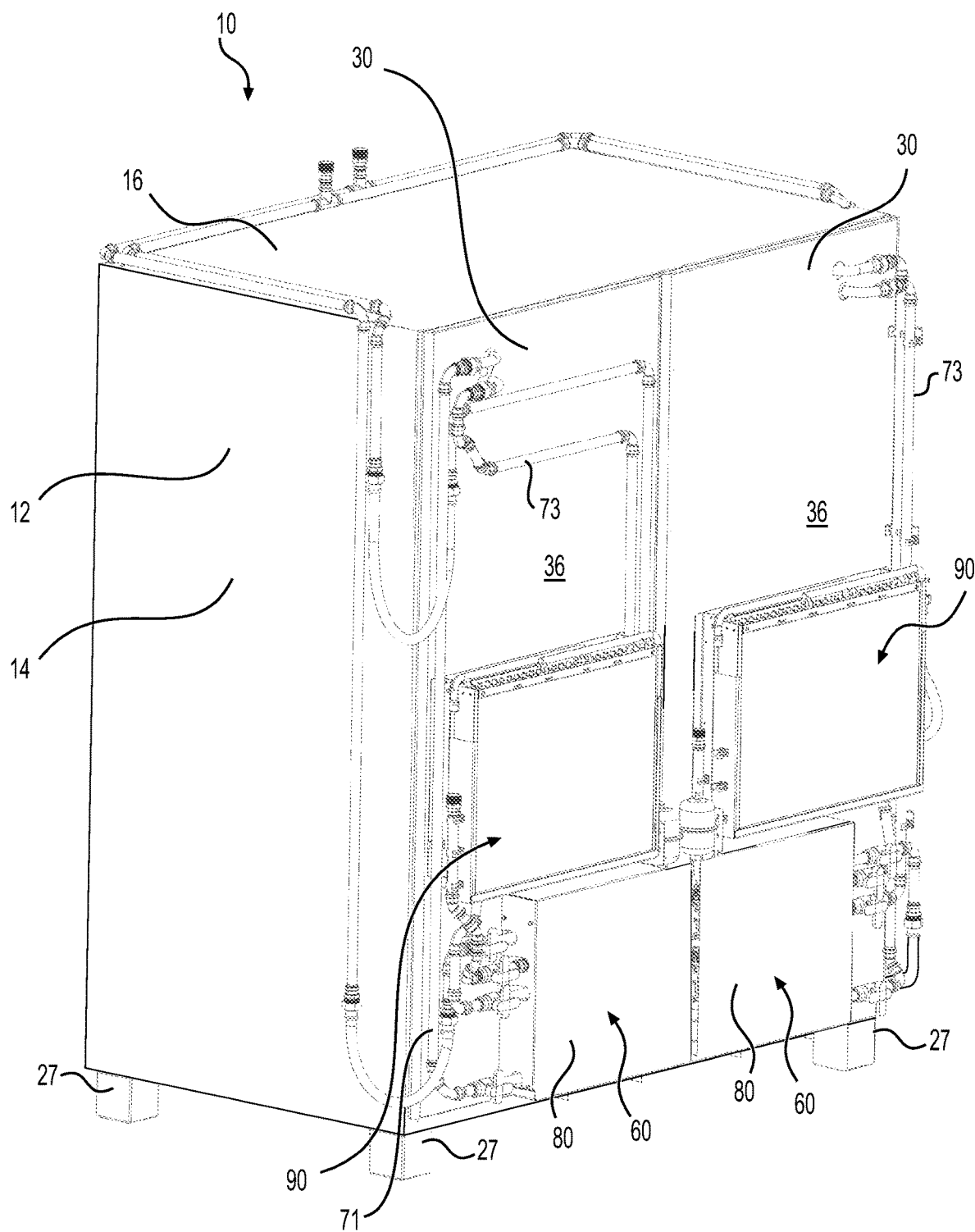
FIG. 1 is a perspective view, taken from a top, right side, of an uninterruptible power supply (UPS) according to an embodiment of the present technology.

As shown in FIG. 1, the UPS 10 has a housing 12 defining an interior space 15 within which the various electrical components of the UPS 10 are disposed. The housing 12 has left and right walls 14, a top wall 16, a bottom wall 18 and a rear wall (not shown) which together define the interior space 15 of the housing 12. The top wall 16 and the bottom wall 18 extend generally horizontally while the left and right walls 14 and the rear wall extend generally vertically. The housing 12 also includes a frame 20 (shown in more detail in FIGS. 7 and 8) for supporting the different walls of the housing 12, as well as the various electrical components of the UPS 10. For instance, in this embodiment, the frame 20 includes four vertical beams 22 (one disposed at each corner of the UPS 10), three upper and three lower lateral beams 24 each extending laterally between two of the vertical beams 22, and two upper and two lower transversal beams 26 that extend transversally to the vertical and lateral beams 22, 24. Each transversal beam 26 is connected between two of the vertical beams 22. The frame 20 also includes four legs 27, each connected to a lower end of a corresponding one of the vertical beams 22. The legs 27 are configured to be supported by a support surface (e.g., the floor). Moreover, the legs 27 elevate the bottom wall 18 off the support surface. The housing 12 and its frame 20 may be configured in any other suitable way in other embodiments.

The interior space 15 of the housing 12 is accessible via two doors 30 disposed on a front side of the UPS 10 and operatively connected to the housing 12. The doors 30 are selectively opened and closed to access the interior space 15. In particular, the doors 30 are hinged to the housing 12 such that each door 30 can be pivotably opened and closed about respective hinges 32 defining a hinge axis extending vertically. Each door 30 is generally rectangular and has an interior side 34 and an exterior side 36. The interior side 34 faces the interior space 15 when the door 30 is closed. One of the doors 30 has a lock 36 which is actuated via a key (not shown) when the doors 30 are closed to lock or unlock the doors 30. Such locks are known and therefore will not be described in greater detail herein.

The doors 30 support pumping modules 60 and air-to-liquid heat exchangers 90 which assist in cooling the UPS 10. Notably, the pumping modules 60 and air-to-liquid heat exchangers 90 are mounted to the doors 30 so that the UPS 10 is cooled in a more autonomous manner than in conventional UPSs. The pumping modules 60 and the air-to-liquid heat exchangers 90 will be described further below.

Figure 6:
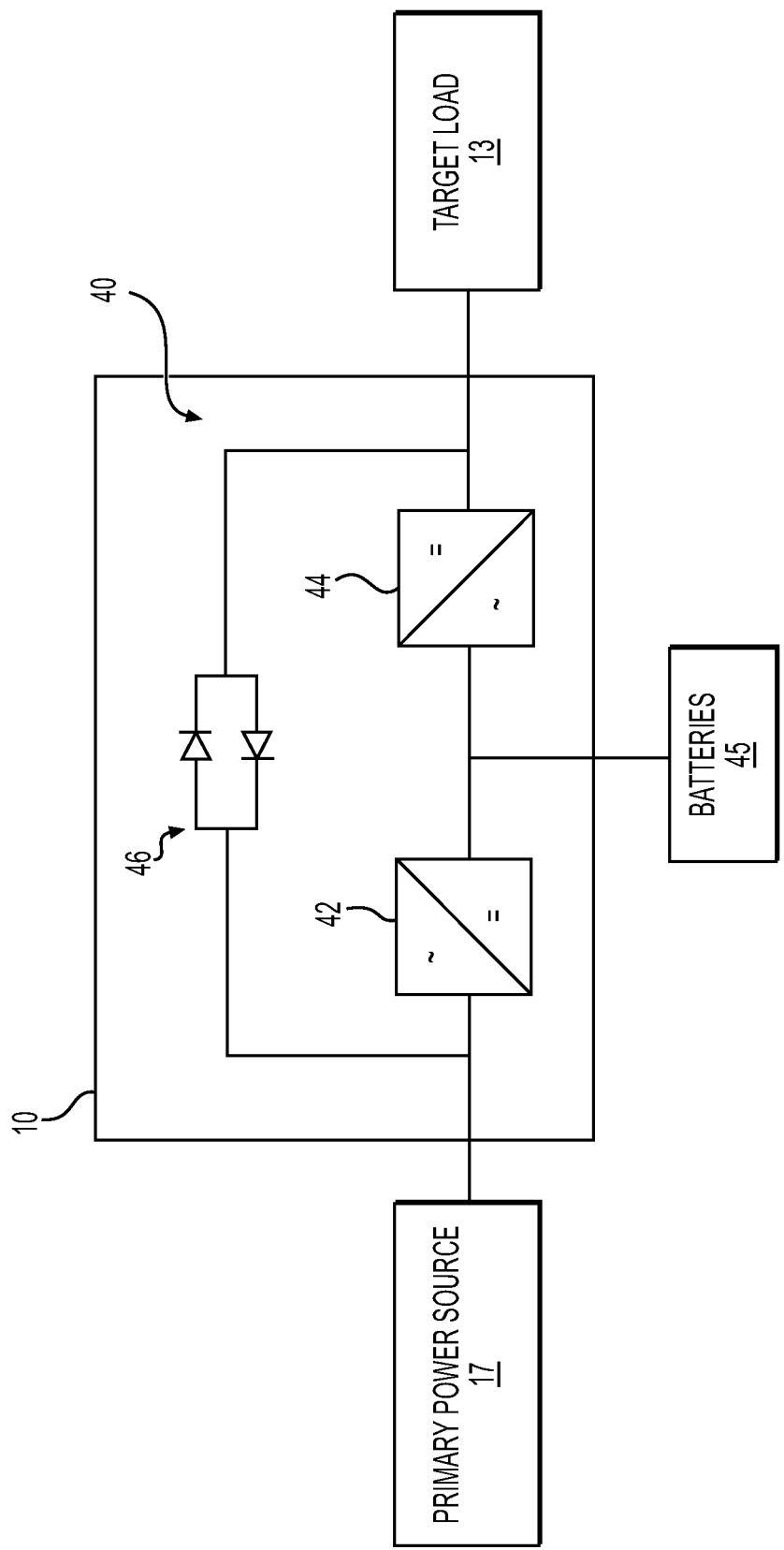
FIG. 6 is a schematic illustration of an electrical system of the UPS of FIG. 1.

As shown in FIG. 6, the UPS 10 has an electrical system 40 enclosed within the housing 12, namely in the interior space 15. The electrical system 40 includes a plurality of electrical components which work together to ensure the operation of the UPS 10 to provide backup power to the target load. In this embodiment, the UPS 10 is a double conversion online UPS. Notably, the electrical system 40 includes a rectifier module 42 configured to receive electrical power from the primary power source 17, an inverter module 44 configured to supply electrical power to the target load 15, and an internal static bypass switch 46 configured to bypass the rectifier module 42 and the inverter module 44.

The rectifier module 42 is electrically connected to a plurality of batteries 45 for charging thereof. In this embodiment, the batteries 45 are disposed outside of the UPS 10, namely in a room adjacent to the room of the data center 100 within which the UPS 10 is located. In other embodiments, the batteries 45 may be part of the electrical system 40 of the UPS 10 and enclosed within the interior space 15 of the housing 12. The rectifier module 42 charges the batteries 45 by converting the alternating current (AC) electrical charge provided by the primary power supply 17 to direct current (DC) electrical charge that is used as an input to charge the batteries 45. On the other hand, the inverter module 44 is electrically connected to the batteries 45 for supplying electrical power from the batteries 45 to the target load 13. In particular, the inverter module 44 is configured to convert the DC electrical charge of the batteries 45 to AC electrical charge to supply power to the target load 13. For its part, the internal static bypass switch 46 allows instantaneously bypassing the rectifier module 42, the inverter module 44 and the batteries 45, so as to power the target load 13 directly via the primary power source 17, for instance when there is an internal fault or failure within the electrical system 40 of the UPS 10. This can thus ensure power continuity to the target load 13 while the UPS 10 is being fixed.

Figure 15:
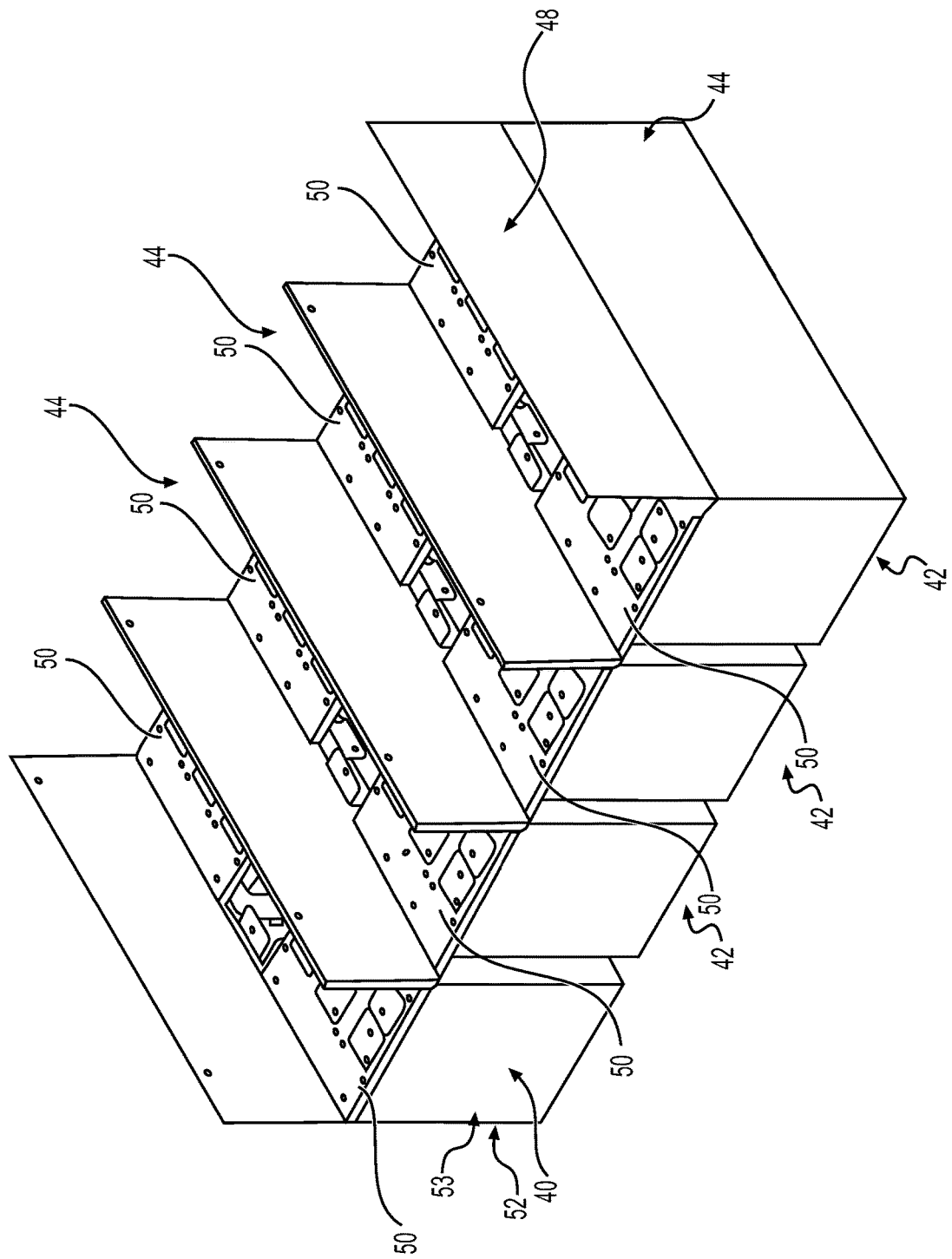
FIG. 15 is a perspective view of a booster bridge and three rectifier/inverter bridges of the UPS, with a liquid cooling device being mounted to each bridge.
Figure 16:
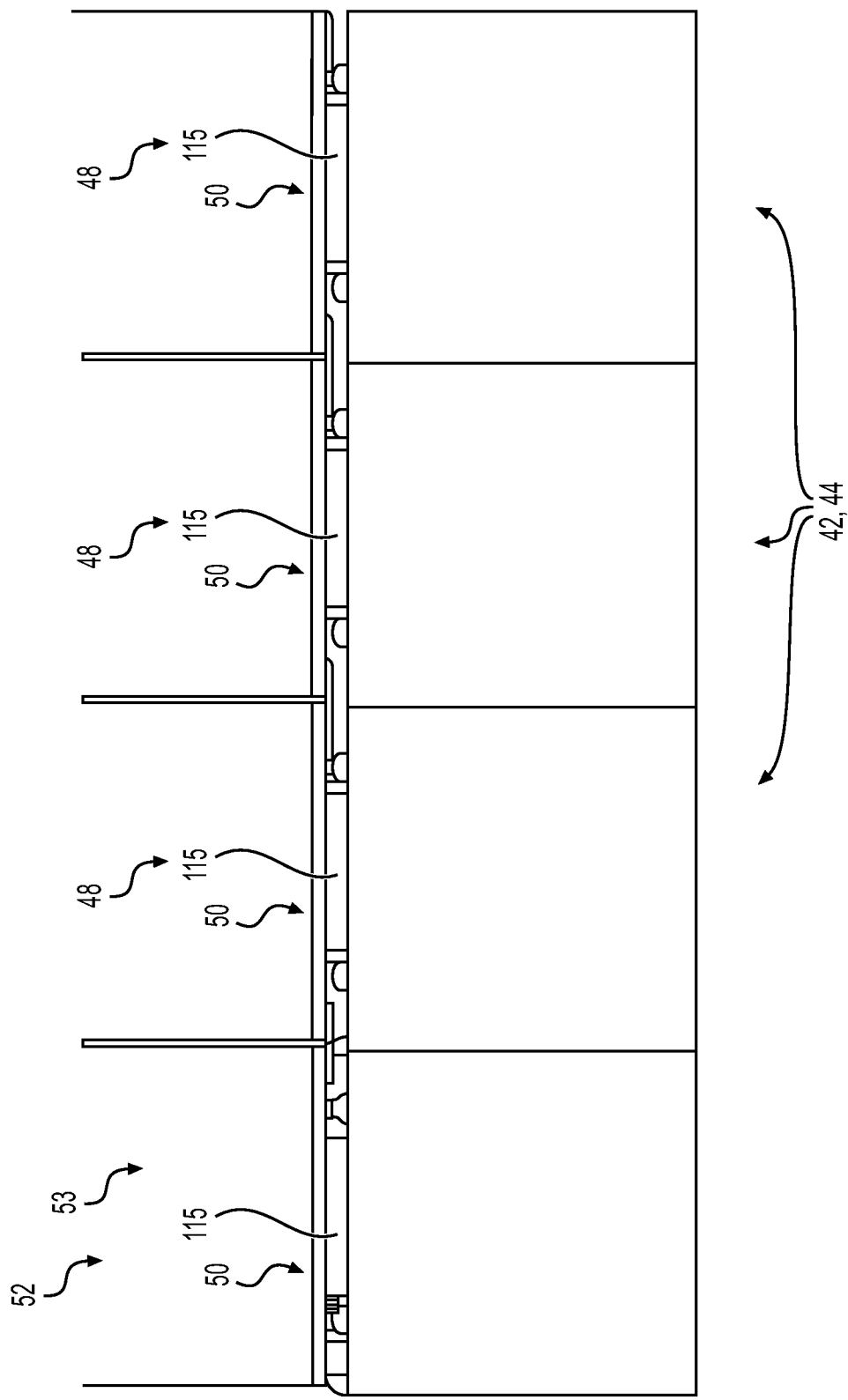
FIG. 16 is a front elevation view of the bridges of FIG. 15.

As shown in FIGS. 15 and 16, the electrical system 40 also includes a booster module 52 electrically connected to the batteries 45 and to the rectifier and inverter modules 42, 44. The booster module 52 is configured to compensate for undervoltage of the power supplied by the batteries 45. The booster module 52 comprises a booster bridge 53 which may include a plurality of chokes.

The rectifier module 42, the inverter module 44, the internal static bypass switch 46 and the booster module 52 include different types of semiconductors. For instance, as shown in FIGS. 15 and 16, the rectifier module 42, the inverter module 44 and the booster module 52 include a plurality of semiconductors 115. The semiconductors may be of any suitable type. In this embodiment, the semiconductors 115 of the rectifier module 42, the inverter module 44 and the booster module 52 are insulated-gate bipolar transistors (IGBT). The semiconductors 115 of the rectifier module 42 and the inverter module 44 are comprised by rectifier-inverter bridges 48. The semiconductors 115 of the booster module 52 are comprised by the booster bridge 53. Furthermore, the internal static bypass switch 46 also has a plurality of semiconductors (not shown) which are thyristor modules. The semiconductors of the rectifier and inverter modules 42, 44, of the internal static bypass switch 46 and of the booster module 52 are commonly known and manufactured for example by Semikron©. Other different types of semiconductors are also contemplated.

Figure 19:
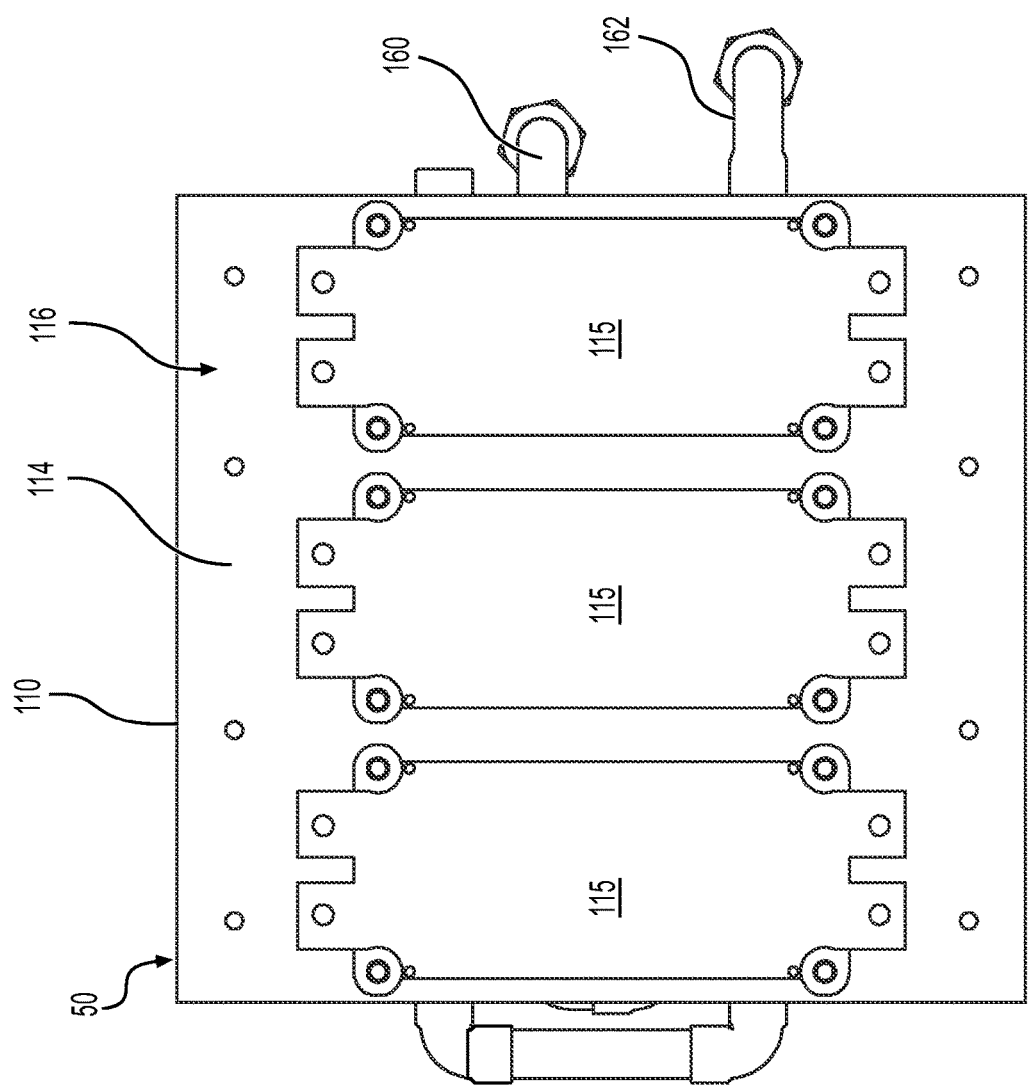
FIG. 19 is a bottom plan view of the liquid cooling device of FIG. 17.
Figure 20:
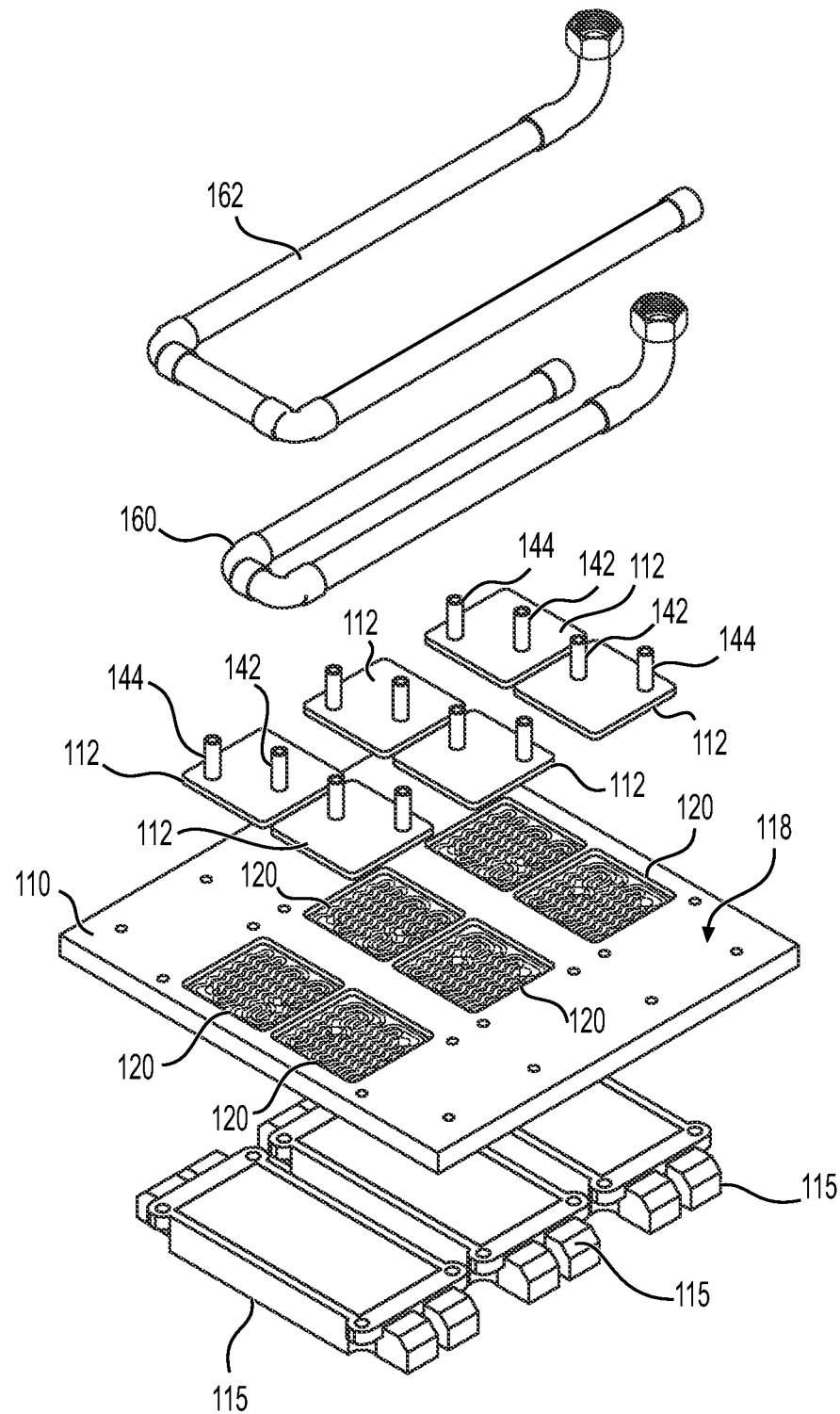
FIG. 20 is an exploded view of the liquid cooling device of FIG. 17, shown with three semiconductors to be cooled by the liquid cooling device.

As can be seen, in FIGS. 19 and 20, in this embodiment, each semiconductor 115 has a generally rectangular upper surface. Moreover, each semiconductor 115 has two connectors at opposite ends thereof which allow the semiconductor 115 to be secured to a liquid cooling device as will be described in more detail below. Notably, each connector is configured to receive a fastener therein.

It is contemplated that the electrical system 40 could be configured differently in other embodiments. For instance, in other embodiments, the UPS 10 may be of a type other than a double conversion online UPS and therefore the electrical system 40 may include additional electrical components or some components may be omitted.

Furthermore, the skilled person will understand that the electrical system 40 includes various other electrical components which are not described here for brevity, namely as the specific configuration of the electrical system 40 is not of particular importance in the context of the present application and therefore this description of the electrical system 40 is not meant to be exhaustive. For instance, other electrical components such as a backfeed protection device, filters, chokes, capacitors, fuses, etc. are also part of the electrical system 40.

Various of the above-described components of the electrical system 40 generate a significant amount of heat during use. Consequently, in order to prevent overheating of the components (which may otherwise negatively affect their performance), the UPS 10 has a cooling system that combines both liquid cooling and air cooling. More specifically, the UPS 10 is cooled by (i) circulating ambient air through the interior space 15 of the UPS 10 to evacuate heated air therefrom via the two air-to-liquid heat exchangers 90; and (ii) routing water to a plurality of liquid cooling devices 50 disposed in the interior space 15 of the UPS 10 to cool certain components of the electrical system 40.

Figure 14:
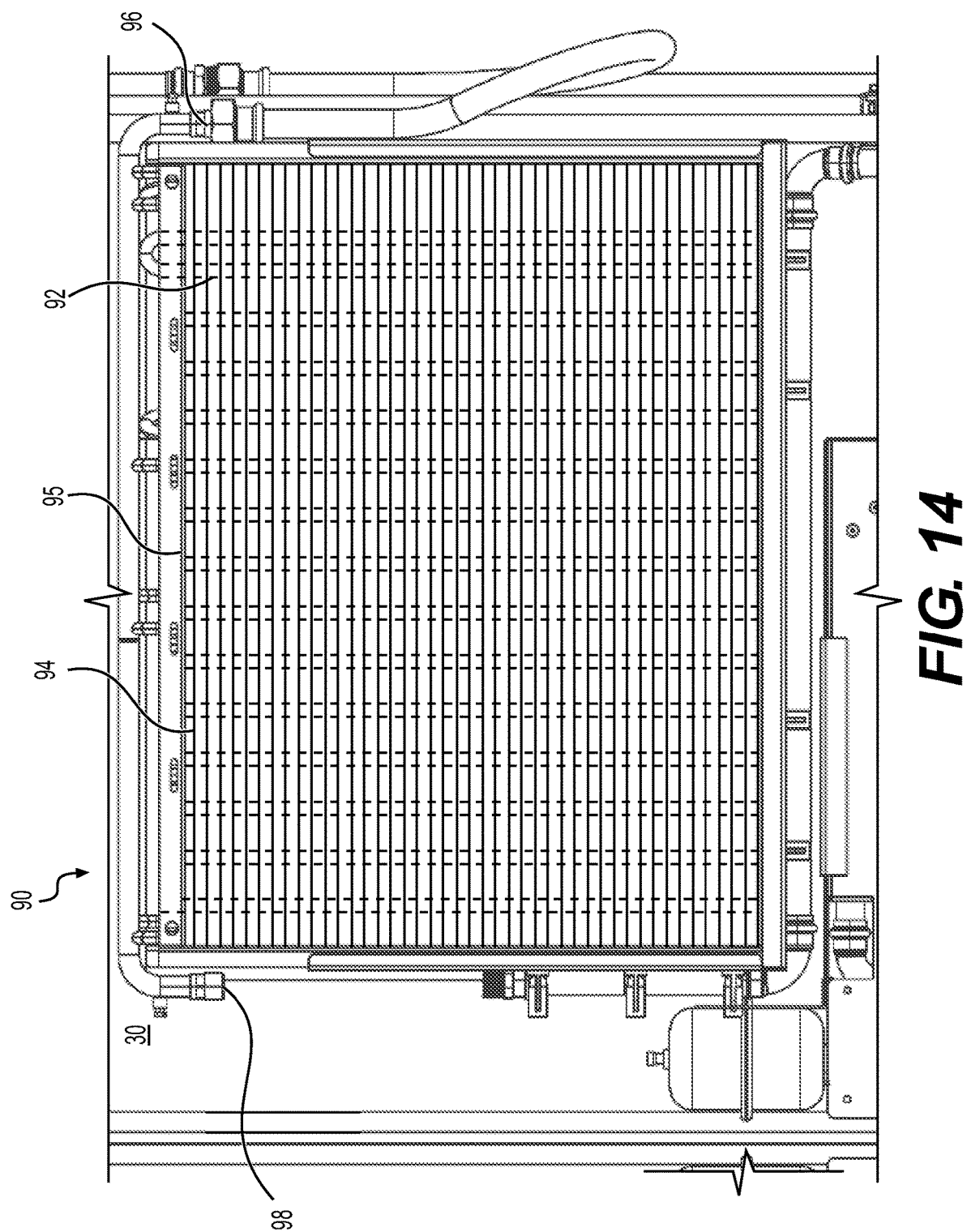
FIG. 14 is a front elevation view of an air-to-liquid heat exchanger of the UPS of FIG. 1.

The manner in which the air-to-liquid heat exchangers 90 ensure the air cooling of the UPS 10 will now be described. Both air-to-liquid heat exchangers 90 are identical and therefore only one of the air-to-liquid heat exchangers 90 will be described herein with reference to FIG. 14. It is understood that the description applies to both air-to-liquid heat exchangers 90.

The air-to-liquid heat exchanger 90 is configured to cool air flowing therethrough. The air-to-liquid heat exchanger 90 includes a cooling coil 92 (shown in dashed lines in FIG. 14) for circulating fluid therethrough. In particular, in this embodiment, water is circulated through the cooling coil 92. To that end, the cooling coil 92 has an inlet 96 and an outlet 98 to respectively feed water to and discharge water from the cooling coil 92. As will be explained in greater detail below, the cooling coil 92 is fluidly connected to a corresponding one of the pumping modules 60. The air-to-liquid heat exchanger 90 also includes a plurality of fins 94 that are in thermal contact with the cooling coil 92. The fins 94 are spaced apart from one another to allow air to flow therebetween and thus through the air-to-liquid heat exchanger 90. The air-to-liquid heat exchanger 90 has a frame 95 supporting the cooling coil 92 and the fins 94.

In this embodiment, the air-to-liquid heat exchanger 90 is mounted to a corresponding one of the doors 30. Notably, the frame 95 of the air-to-liquid heat exchanger 90 is fastened to the exterior side 36 of the door 30. The air-to-liquid heat exchanger 90 is disposed in a position vertically higher than the corresponding pumping module 60. As will be explained in more detail below, this vertically higher position of the air-to-liquid heat exchanger 90 facilitates the circulation of air through the UPS 10. Moreover, the air-to-liquid heat exchanger 90 is aligned with a door opening 91 (shown in dashed lines in FIG. 3) defined by the door 30 so that air can flow from the interior space 15 through the door opening 91 and through the air-to-liquid heat exchanger 90.

Figure 7:
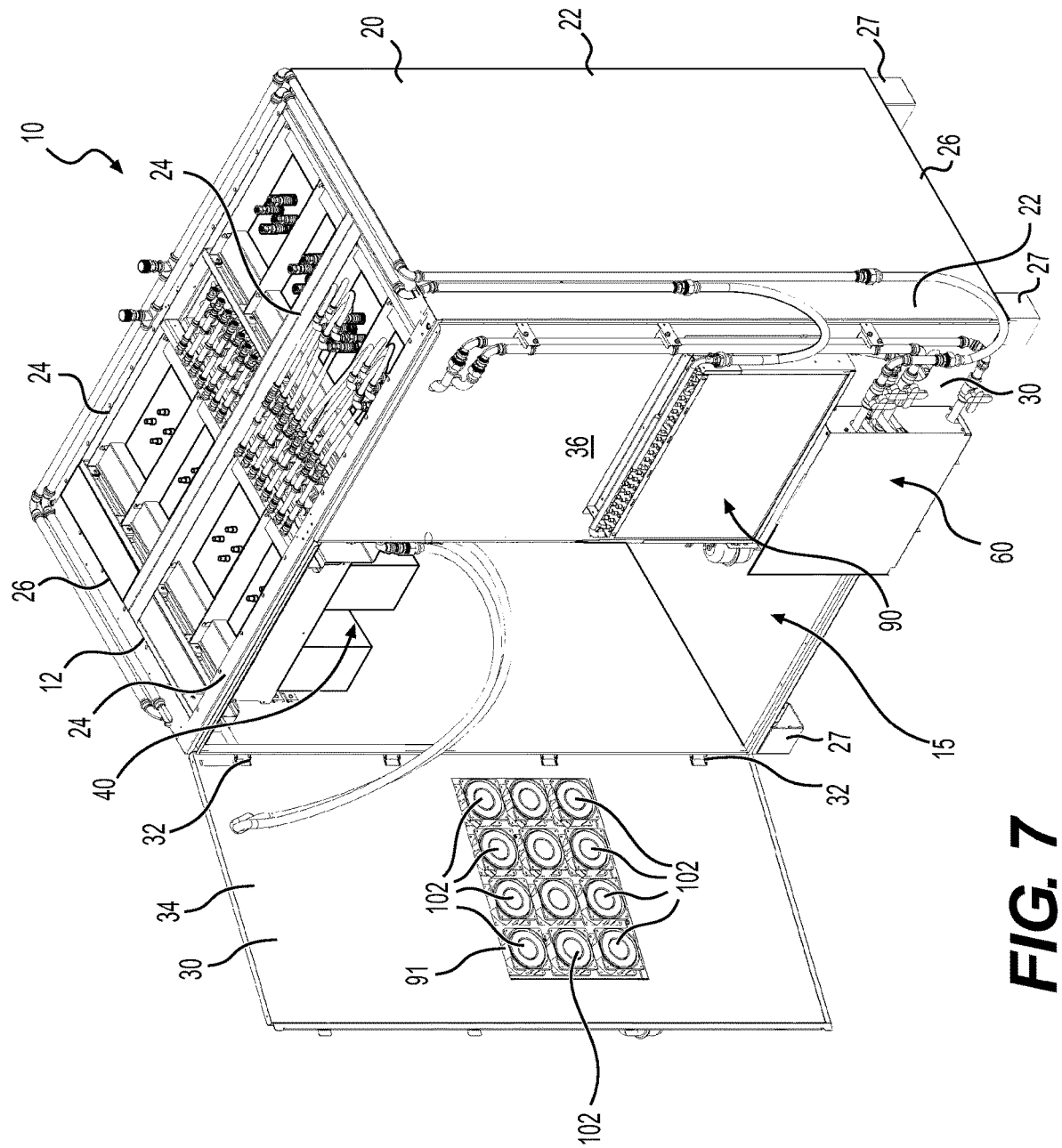
FIG. 7 is a perspective view, taken from a top, left side, of the UPS of FIG. 1, shown with various walls of a housing of the UPS removed and with a door of the UPS being open.
Figure 8:
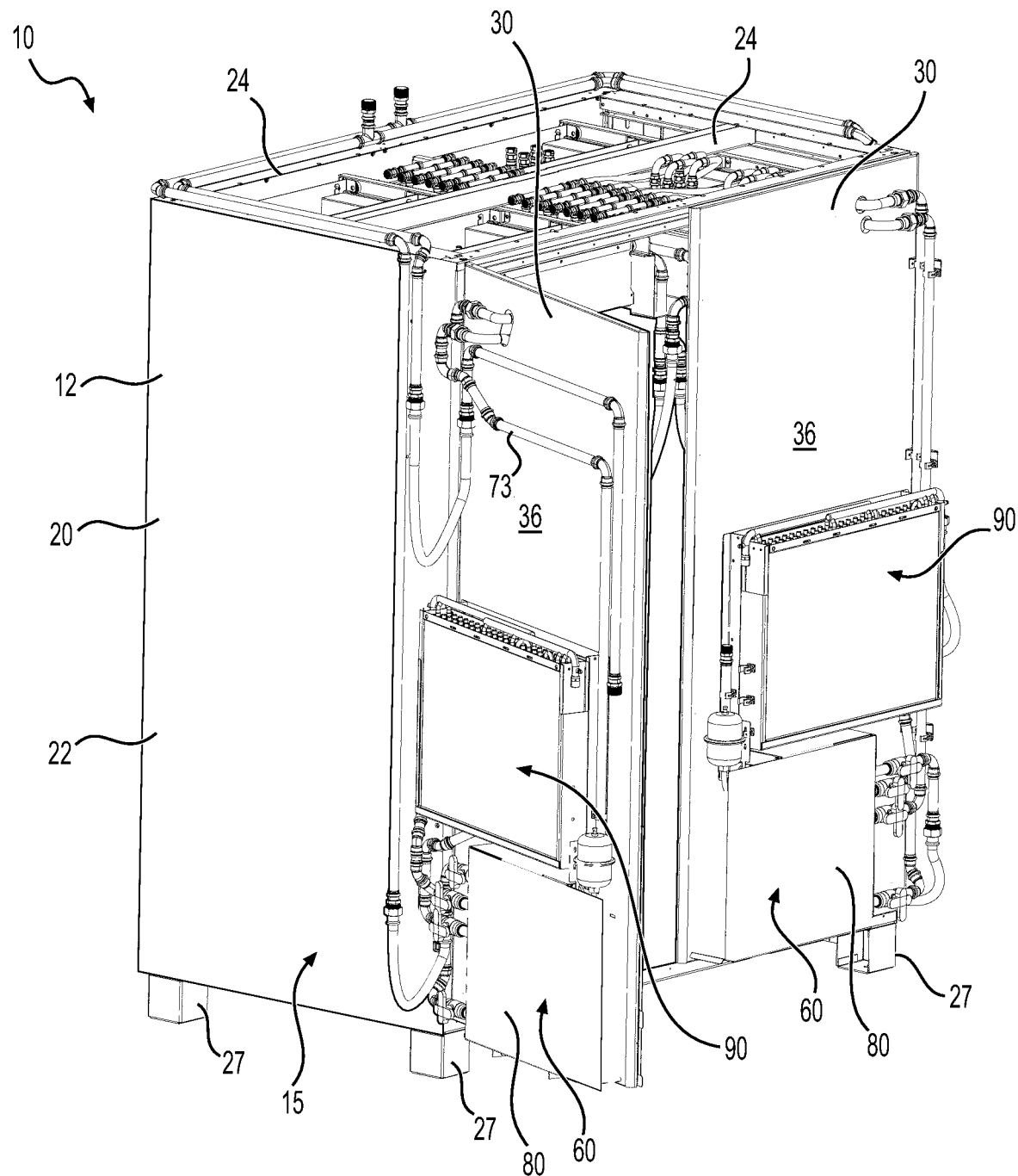
FIG. 8 is a perspective view, taken from a top, right side, of the UPS of FIG. 7.

In order to force air through the air-to-liquid heat exchanger 90, in this embodiment, as shown in FIG. 7, a plurality of fans 102 are mounted to each door 30, on the interior side 34 thereof. In particular, in this embodiment, twelve fans 102 are mounted to each door 30 and are aligned with the corresponding door opening 91 such that, when the fans 102 are activated, they force air through the door openings 91 and through the air-to-liquid heat exchangers 90. As can be seen, when the doors 30 are closed, the fans 102 are contained within the housing 12. In this embodiment, the fans 102 are relatively small in size and a rotation axis of the impeller of each fan 102 extends generally horizontally.

Figure 4:
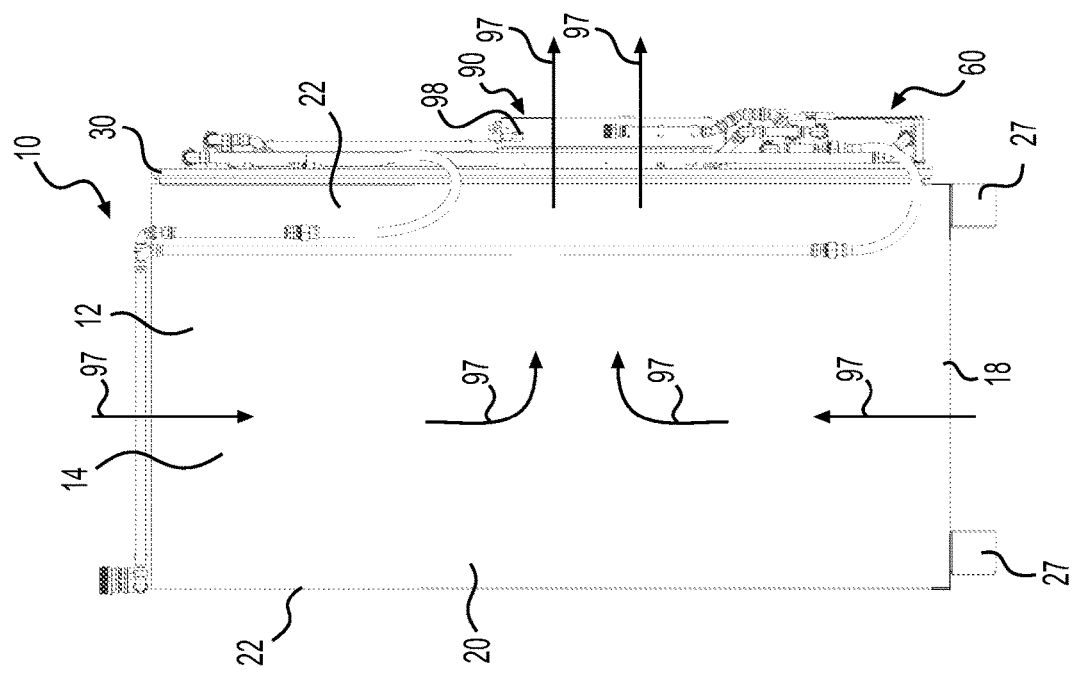
FIG. 4 is a right side elevation view of the UPS of FIG. 1.

As designated by arrows 97 in FIG. 4, operation of the fans 102 causes air to be pulled into the interior space 15 of the housing 12 through the top wall 16 and the bottom wall 18 and forced out through the door openings 91 and the air-to-liquid heat exchangers 90. In particular, the top wall 16 defines a plurality of top openings 23 (FIG. 5) which, in this embodiment, are slits. Similarly, the bottom wall 18 defines a plurality of bottom openings (not shown) in the shape of slits. Ambient air is thus drawn into the interior space 15 through the top openings 23 and the bottom openings of the top wall 16 and the bottom wall 18. The air drawn into the interior space 15 absorbs some of the heat generated by the UPS 10 and is then forced out through the door openings 91 and through the air-to-liquid heat exchangers 90, where heat is transferred from the air to the water being circulated through the cooling coil 92. Thus, the air discharged on the other side of the air-to-liquid heat exchanger 90 is cooled and therefore a cool ambient temperature can be maintained in the surroundings of the UPS 10 (in this case the data center). As will be understood, the positioning of the air-to-liquid heat exchangers 90 vertically higher than the pumping modules 60 on the doors 30 facilitates pushing out air (through the air-to-liquid heat exchangers 90) incoming from the top openings 23 and the bottom openings of the top wall 16 and the bottom wall 18 with an adequate distribution of the air flow as the air-to-liquid heat exchangers 90 are approximately at mid-height of the doors 30.

Figure 9:
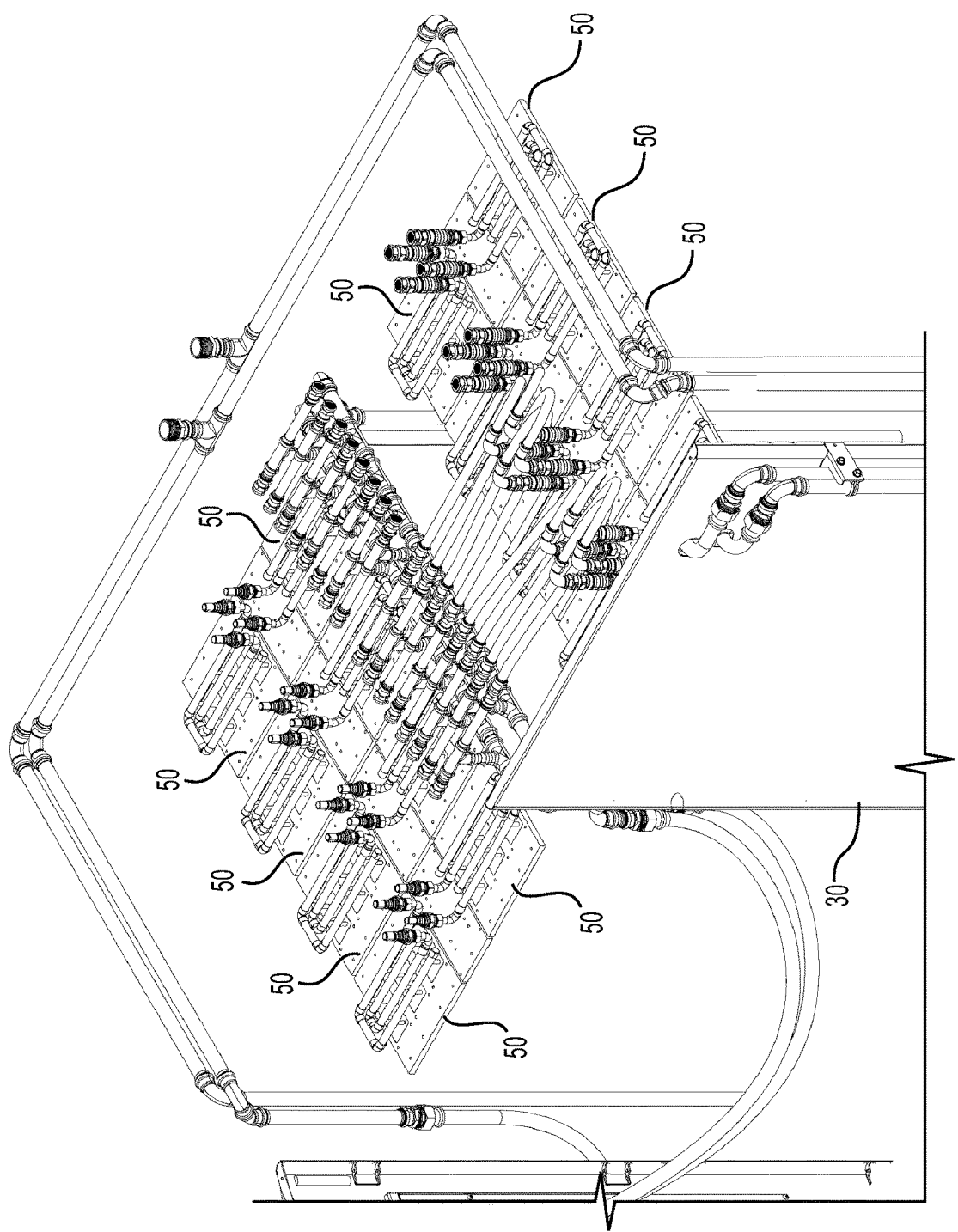
FIG. 9 is a perspective view, taken from a top, left side, of part of the UPS of FIG. 7, showing a plurality of liquid cooling devices of the UPS.

As mentioned above, and as shown in FIGS. 9 and 10, the UPS 10 includes the plurality of liquid cooling devices 50 enclosed in the interior space 15 of the housing 12 for cooling different electrical components of the electrical system 40. In particular, in this embodiment, the liquid cooling devices 50 are mounted to the semiconductors of the rectifier module 42, the inverter module 44 and the internal static bypass switch 46 for cooling thereof Notably, as the semiconductors generate heat during operation thereof, each liquid cooling device 50 absorbs heat from a corresponding semiconductor and evacuates the heat via fluid circulated through a fluid conduit 125 defined by the liquid cooling device 50 (described in greater detail further below). Such liquid cooling devices 50 are also commonly referred to as "cold plates" or "water blocks" and can use different types of fluids for transferring heat out of the liquid cooling device. In this embodiment, water is circulated through the liquid cooling devices 50 to evacuate heat therefrom. It is contemplated that other fluids may be used instead of water (e.g., dielectric fluid).

It should be understood that the liquid cooling devices 50 may be mounted to electrical components other than the semiconductors. Notably, the liquid cooling devices 50 may be mounted to various other heat-generating electrical components of the electrical system 40, including for example chokes.

The liquid cooling devices 50 will be described in greater detail further below.

The liquid cooling devices 50 define part of an internal fluid circuit C1 through which water is circulated locally at the UPS 10. Conversely, in this embodiment, in use, the cooling coils 92 of the air-to-liquid heat exchangers 90 define part of an external fluid circuit C2 through which water is circulated at least in part externally of the UPS 10, namely through external cooling equipment 75 (shown schematically in FIGS. 11 and 13). The external cooling equipment 75 can be any type of equipment configured to cool the water being routed thereto from the cooling system of the UPS 10. For instance, in this example of implementation, the external cooling equipment 75 is a dry cooler installed in an exterior of the data center (e.g., on the roof thereof).

Since the internal fluid circuit C1 is provided to feed water to the liquid cooling devices 50, the internal fluid circuit C1 may alternatively be referred to as a "liquid cooling circuit". Similarly, since the external fluid circuit C2 is provided to feed water to the air-to-liquid heat exchangers 90, the external fluid circuit C2 may alternatively be referred to as an "air cooling circuit".

In order to circulate water through the liquid cooling circuit C1 (including the liquid cooling devices 50), two pumping modules 60 are provided. Notably, as mentioned above, each pumping module 60 is mounted to a corresponding one of the two doors 30 and disposed on the exterior side 36 thereof. In this embodiment, both pumping modules 60 are configured identically, namely being a mirror image of one another. Thus, only one of the pumping modules 60 will be described in detail herein. It is to be understood that the description applies to both pumping modules 60.

Figure 11:
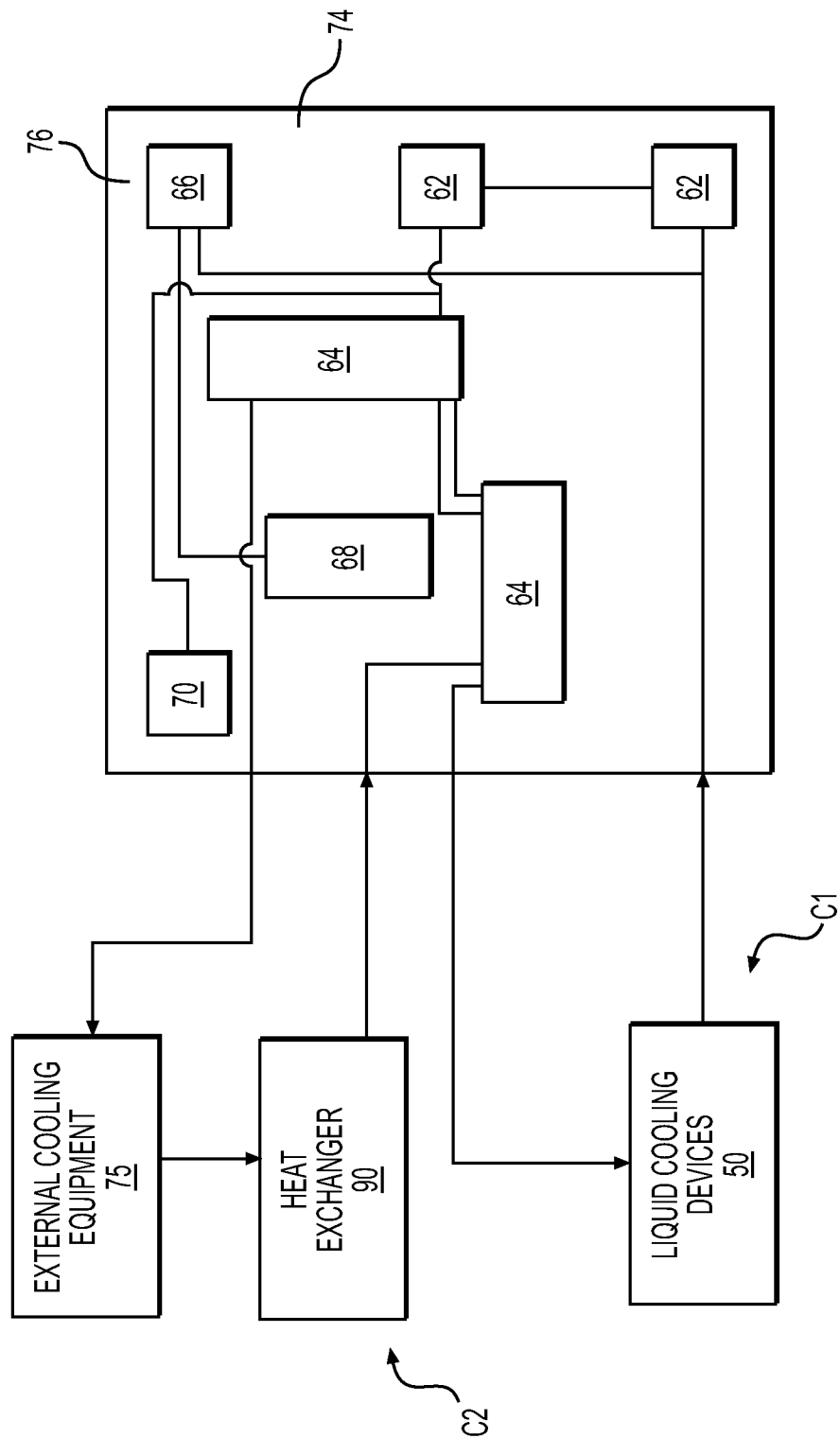
FIG. 11 is a block diagram showing a part of a pumping module of the UPS of FIG. 1.
Figure 13:
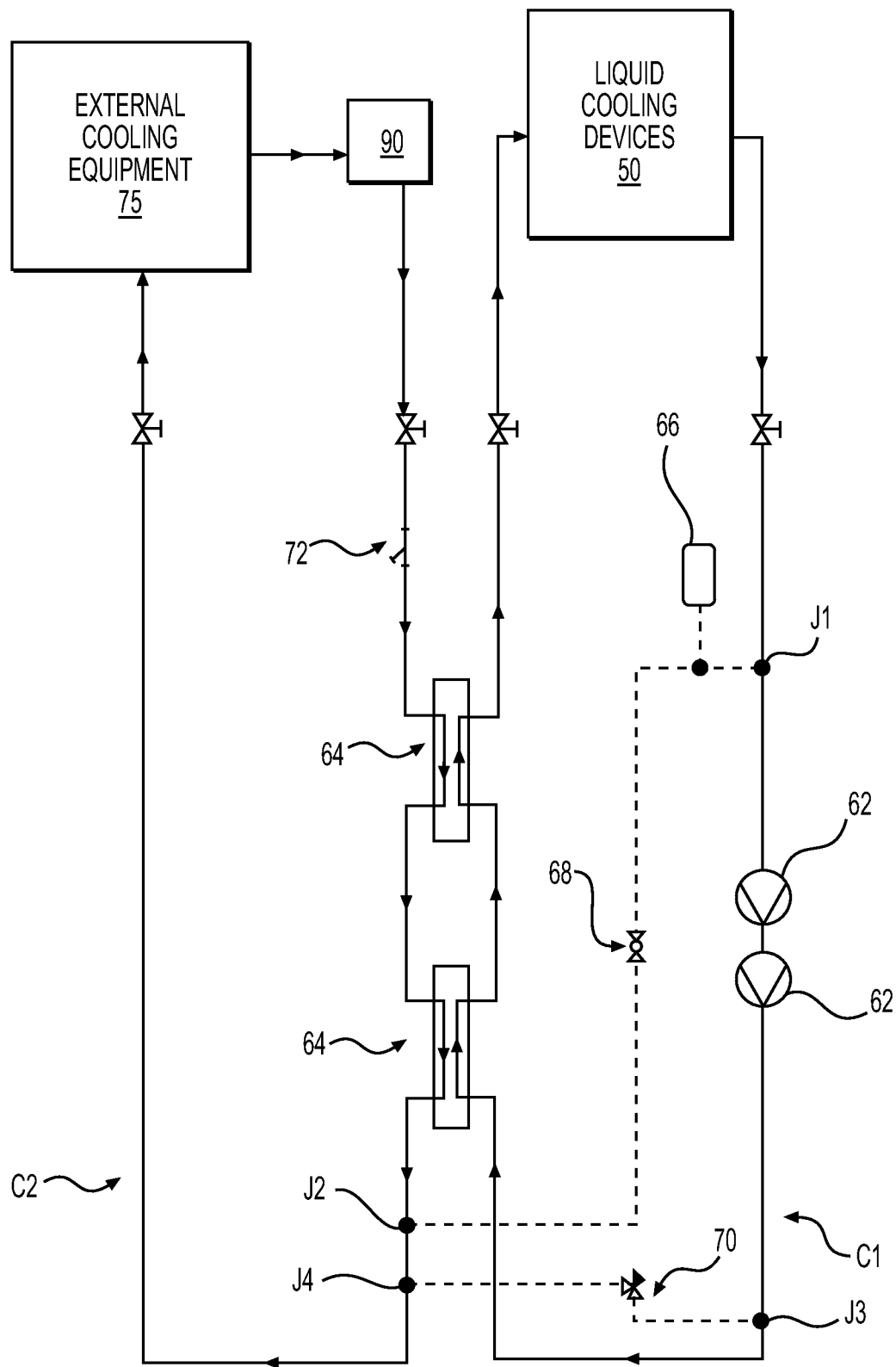
FIG. 13 is a diagram of a liquid cooling circuit and an air cooling circuit of the UPS of FIG. 1.

With reference to FIGS. 11 and 13, the pumping module 60 includes two pumps 62 that are fluidly connected to the liquid cooling devices 50 for circulating water through the liquid cooling circuit C1 of the UPS 10. It is contemplated that fewer or more pumps 62 may be provided in other embodiments (e.g., a single pump 62). In this embodiment, the two pumps 62 are of a relatively small size to accommodate their positioning on the corresponding door 30 since the door 30 has a limited surface area for placing the pumping module 60. Notably, the pumps 62 are fluidly connected in series and thus functionally could be replaced by a larger, more powerful pump. However, due to restrictions imposed by the size of the door 30, in this embodiment, two pumps 62 are provided instead of a larger one. Furthermore, two pumps 62 fluidly connected adds a level of redundancy to the pumping module 60, notably as if one of the pumps 62 stops working, the second pump 62 can continue ensuring the flow of water in the liquid cooling circuit C1.

The pumping module 60 also includes two plate heat exchangers 64, fluidly connected in series, for transferring heat from water circulating in the liquid cooling circuit C1 to water circulating in the air cooling circuit C2. Thus, in use, the plate heat exchangers 64 define part of both the liquid cooling and air cooling circuits C1, C2 (without an actual exchange of water between both circuits C1, C2 occurring at the plate heat exchangers 64). As shown in FIG. 13, in the liquid cooling circuit C1, the plate heat exchangers 64 are fluidly connected to the pumps 62 and to the liquid cooling devices 50. In the air cooling circuit C2, the plate heat exchangers 64 of the pumping module 60 are fluidly connected to the cooling coil 92 of the corresponding air-to-liquid heat exchanger 90 (provided on the same door 30 as the pumping module 60) and to the external cooling equipment 75. It is contemplated that fewer or more plate heat exchangers 64 could be provided in other embodiments (e.g., a single plate heat exchanger).

Figure 12:
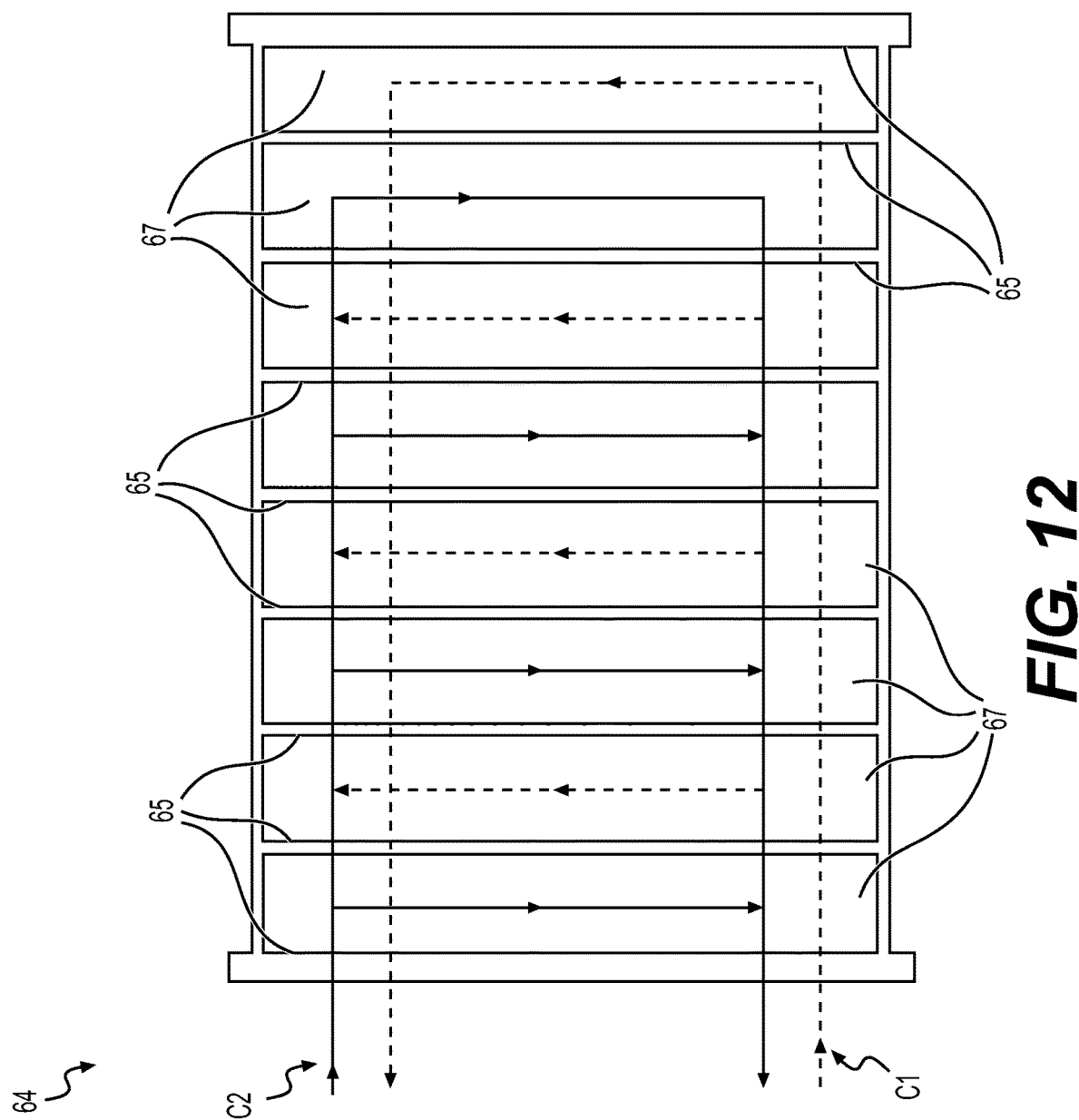
FIG. 12 is a schematic representation of a plate heat exchanger of the pumping module of FIG. 11.

With reference to FIG. 12 which shows a simplified representation of one of the plate heat exchangers 64, each plate heat exchanger 64 includes a plurality of plates 65 stacked with one another and defining gaps 67 therebetween for circulation of fluid between the plates 65. Each plate heat exchanger 64 has two inlets and two outlets, with one inlet and one outlet corresponding to each circuit C1, C2. Each plate 65 defines apertures to fluidly connect a first sub-set of the gaps 67 separately from a second sub-set of the gaps 67, with each sub-set of gaps 67 defining part of a corresponding one of the liquid cooling circuit C1 and the air cooling circuit C2. The gaps 67 of each of sub-set of gaps 67 are arranged in alternating fashion such that a gap 67 defining part of one of the circuits C1, C2 is adjacent to a gap 67 defining part of an other one of the circuits C1, C2. Heat is thus transferred from one of the circuits C1, C2 to an other one of the circuits C1, C2 via the plates 65. As will be understood, water from the liquid cooling and air cooling circuits C1, C2 does not mix in the plate heat exchanger 64. Such plate heat exchangers 64 are known and therefore will not be described in further detail herein.

As shown in FIGS. 11 and 13, the pumping module 60 also includes an expansion tank 66 fluidly connected to the liquid cooling circuit C1. The expansion tank 66 compensates for pressure in the liquid cooling circuit C1 as a function of temperature variations. The expansion tank 66 may be fluidly connected to the liquid cooling circuit C1 at different locations. A pressure reducing valve 68 is fluidly connected between a junction J1 of the liquid cooling circuit C1 and a junction J2 of the air cooling circuit C2. The junction J1 is disposed between the liquid cooling devices 50 and the pumps 62 such that water heated at the liquid cooling devices 50 passes through the junction J1 prior to arriving at the pumps 62. The junction J2 is disposed between the plate heat exchangers 64 and external cooling equipment 75 that defines part of the air cooling circuit C2. Water heated at the plate heat exchangers 64 in the air cooling circuit C2 passes through the junction J2 prior to arriving at the external cooling equipment 75. The pressure reducing valve 68 ensures that makeup water is added to the liquid cooling circuit C1 when the pressure in the liquid cooling circuit C1 drops below a certain value (e.g., 1.5 bars). The pressure reducing valve 68 is omitted in embodiments in which the liquids used in the liquid cooling circuit C1 and the air cooling circuit C2 are different.

A pressure relief valve 70 is also fluidly connected between a junction J3 of the liquid cooling circuit C1 and a junction J4 of the air cooling circuit C2 to open the liquid cooling circuit C1 to the air cooling circuit C2 when the pressure in the liquid cooling circuit C1 exceeds a certain value (e.g., 3 bars). The junction J3 is disposed between the pumps 62 and the plate heat exchangers 64 such that water pumped by the pumps 62 passes through the junction J3 prior to reaching the plate heat exchangers 64. The junction J4 is disposed between the junction J2 and the external cooling equipment 75. The pressure relief valve 70 is omitted in embodiments in which the liquids used in the liquid cooling circuit C1 and the air cooling circuit C2 are different.

The pumping module 60 also includes a strainer 72 for filtering the water in the air cooling circuit C2 before it enters the plate heat exchangers 64. The strainer 72 also filters water in the liquid cooling circuit C1 when the liquid cooling circuit C1 is initially being filled up (during setup of the cooling system of the UPS 10). In some embodiments, an additional strainer with higher filtration capacity may be installed between the junction J2 and the pressure reducing valve 68 to enhance the filtration of water in the liquid cooling circuit C1 when the liquid cooling circuit C1 is initially being filled up.

Figure 2:
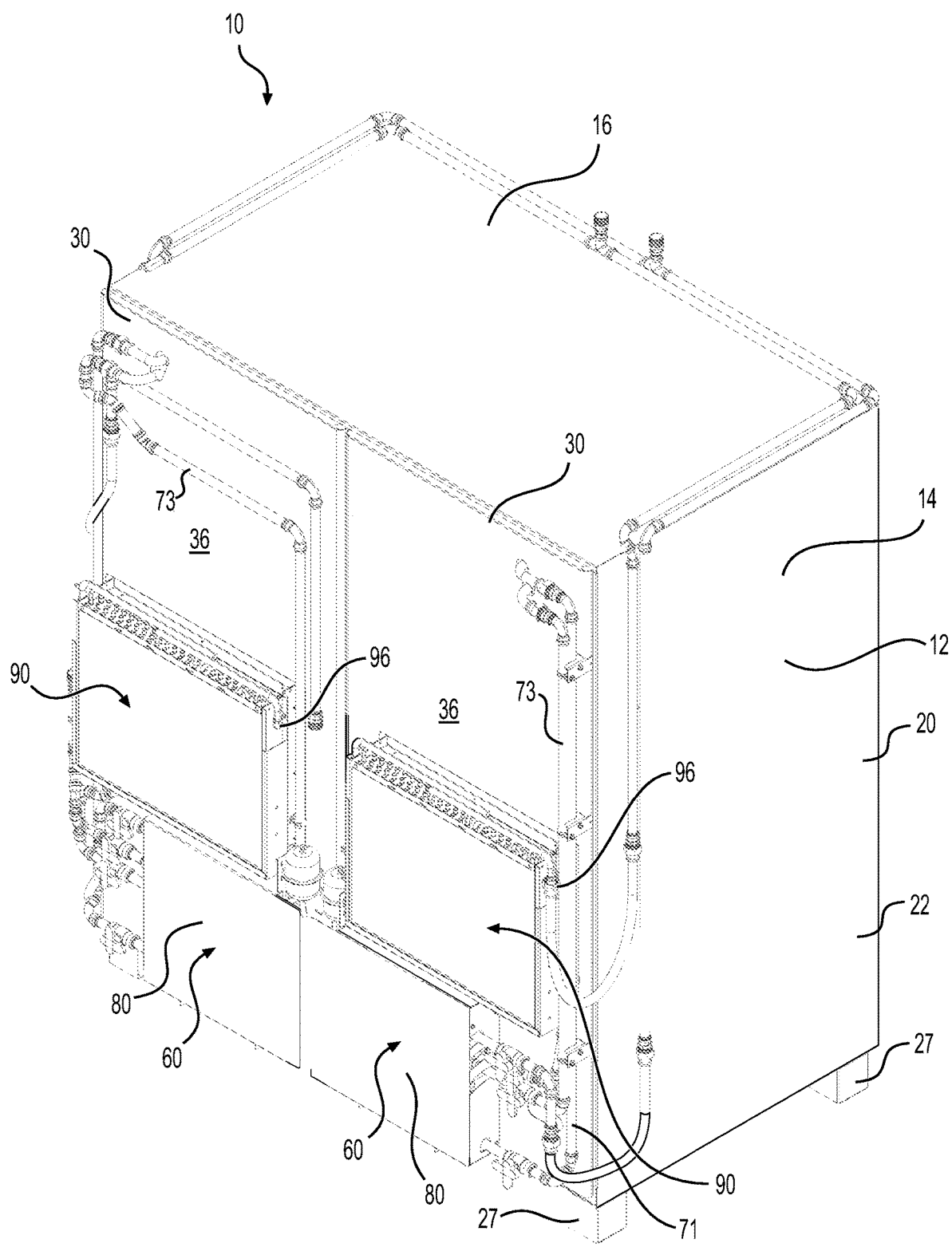
FIG. 2 is a perspective view, taken from a top, left side, of the UPS of FIG. 1.
Figure 3:
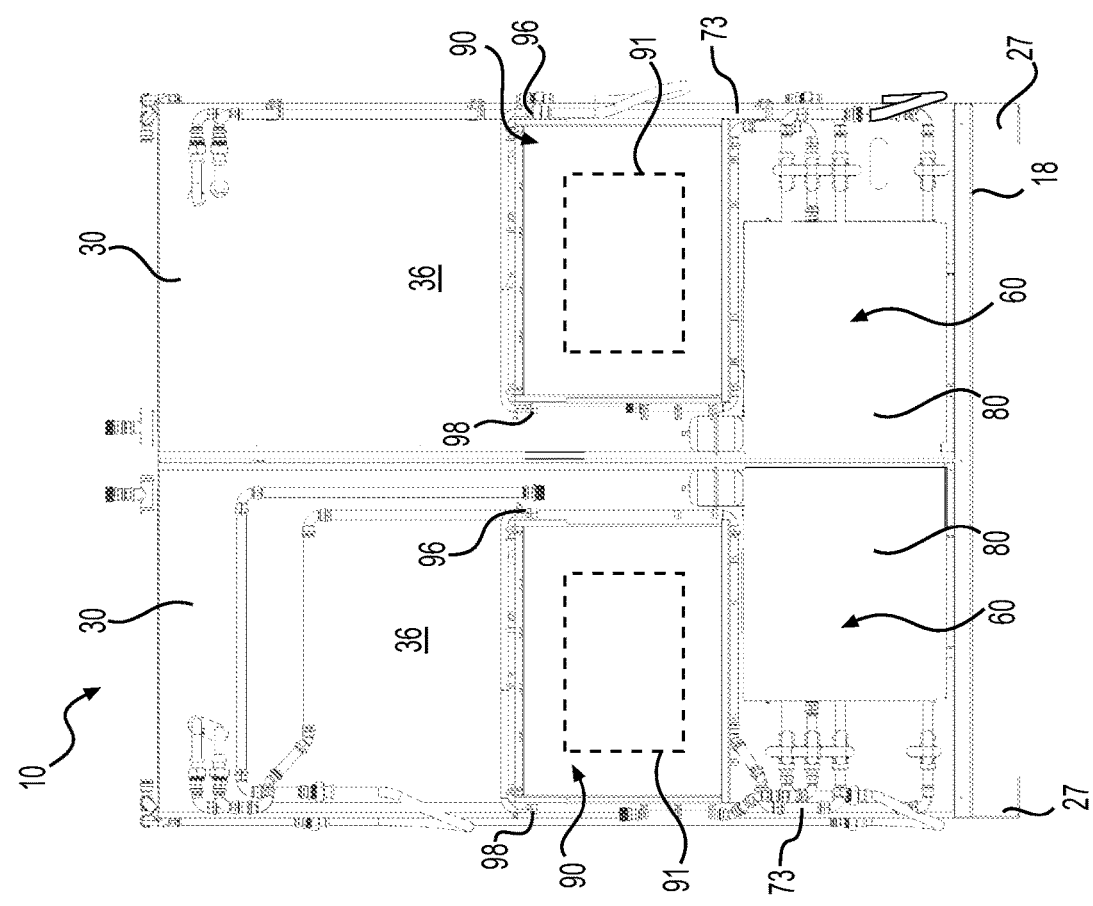
FIG. 3 is a front elevation view of the UPS of FIG. 1.

As shown in FIG. 11, in this embodiment, the components 62, 64, 66, 68, 70, 72 of the pumping module 60 are mounted to a base frame 74 which is connected to the exterior side of the corresponding door 30. The base frame 74 includes a planar panel 76 and a plurality of tabs (not shown) extending generally perpendicular to the panel 76. The various components 62, 64, 66, 68, 70, 72 of the pumping module 60 are supported by the tabs. In particular, the panel 76 and the tabs of the base frame 74 are made from a single sheet of metallic material which is cut and bent into shape. The base frame 74 may be made in different ways in other embodiments. In addition, as shown in FIGS. 1 to 3, a cover panel 80 is removably connected to the base frame 74 to cover the components of the pumping module 60 that are supported by the base frame 74.

Returning now to FIG. 13, the liquid cooling circuit C1 fluidly connects the pumps 62, the plate heat exchangers 64 and the liquid cooling devices 50 to one another. In particular, in the liquid cooling circuit C1, water from the liquid cooling devices 50 flows to the pumps 62 (via piping 71, FIGS. 1, 2) where the water is pumped to the plate heat exchangers 64 for cooling. The pumps 62 thus ensure the circulation of water through the liquid cooling circuit C1. At the plate heat exchangers 64, the water routed thereto by the pumps 62 is cooled as heat is transferred from the water in the liquid cooling circuit C1 to the water routed to the plate heat exchangers 64 in the air cooling circuit C2. Thus, in the liquid cooling circuit C1, cooled water is routed from the plate heat exchangers 64 to the liquid cooling devices 50 (via piping 73, FIGS. 1 to 3) so that the components of the electrical system 40 to which the liquid cooling devices 50 are mounted can be cooled. This process thus continually loops as heated water is routed from the liquid cooling devices 50 to the pumps 62 and so forth. Meanwhile, the air cooling circuit C2 fluidly connects the plate heat exchangers 64 of the pumping module 60, the external cooling equipment 75 and the corresponding air-to-liquid heat exchanger 90. In particular, in the air cooling circuit C2, cooled water is discharged by the external cooling equipment 75 and flows from the external cooling equipment 75 to the inlet 96 of the cooling coil 92. Water then flows through the cooling coil 92 where heat is transferred from the air flowing between the fins 94 (and thus through the air-to-liquid heat exchanger 90) to the water in the cooling coil 92. Then, water flows from the outlet 98 of the cooling coil 92 to an inlet of one of the plate heat exchangers 64. In the plate heat exchangers 64, heat is transferred from water in the liquid cooling circuit C1 to water in the air cooling circuit C2. Thus, in the air cooling circuit C2, heated water is discharged via an outlet of the second consecutive plate heat exchanger 64 and routed to the external cooling equipment 75. This process thus continually loops as the water cooled by the external cooling equipment 75 is routed back to the cooling coil 92 of the air-to-liquid heat exchanger 90.

The piping extending between the main piping of the UPS 10 (that is connected to the various components of the pumping modules 60 and to the air-to-liquid heat exchangers 90) and the liquid cooling devices 50 is flexible piping having quick-connect fittings so as to facilitate installation and maintenance thereof, in addition to increasing safety by reducing the chance of a leak in the piping system.

Other equipment may also define part of the circuits C1, C2 but has not been described for simplicity. For instance, the air cooling circuit C2 is also defined in part by one or more pumps (not shown) to ensure circulation of water in the air cooling circuit C2. These pumps are not present in the UPS 10 in this implementation, but rather form part of the data center installation as the air cooling circuit C2 can also be used in part to route water to other equipment in the data center (e.g., servers) for cooling thereof.

Figure 10:
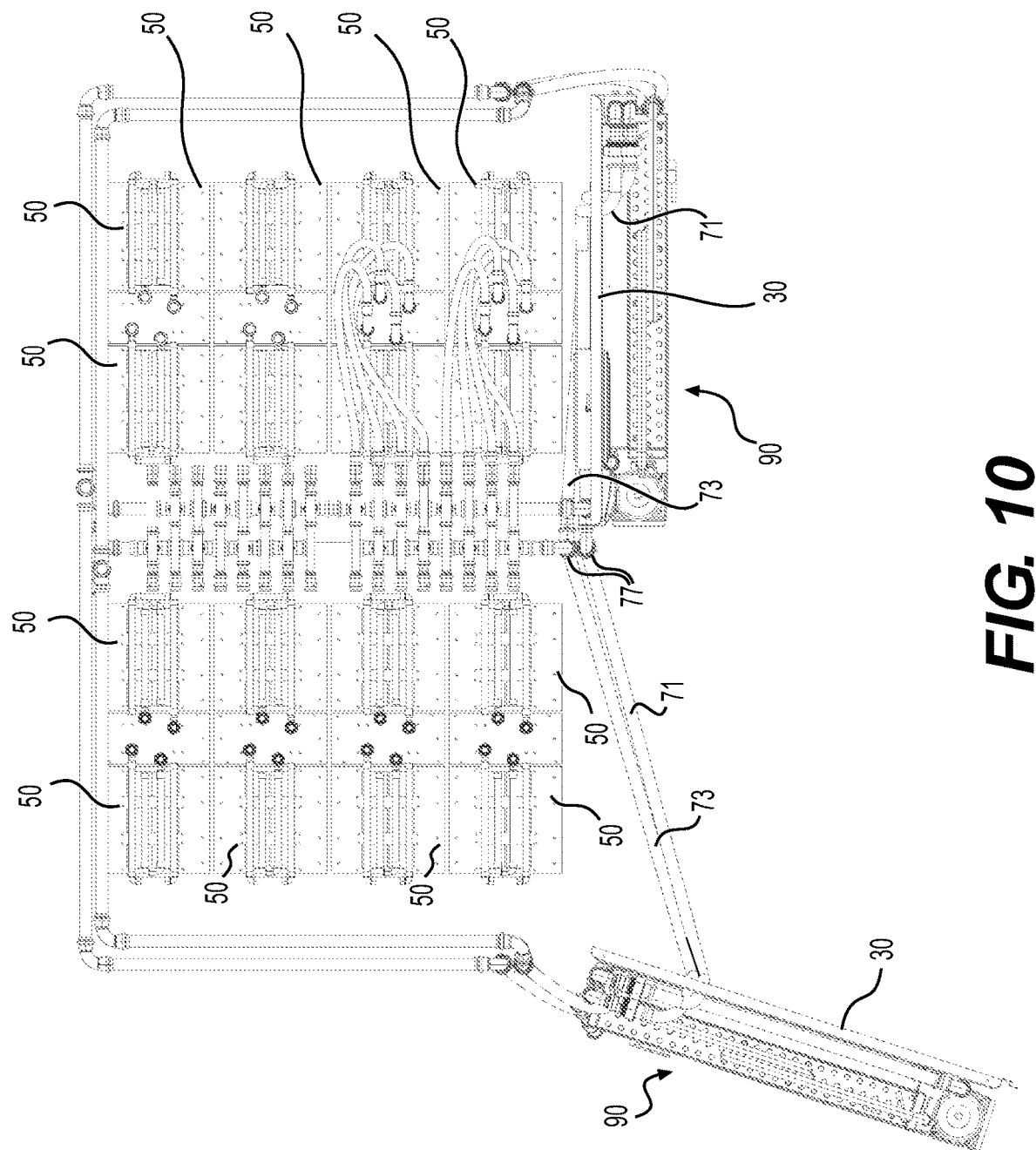
FIG. 10 is a top plan view of the part of the UPS of FIG. 9.

While the liquid cooling circuit C1 has been described in respect of a single one of the pumping modules 60 for simplicity, it is to be understood that, in this embodiment, the liquid cooling circuit C1 of the UPS 10 is defined by the above-described components of both pumping modules 60. Notably, as best shown in FIG. 10, T-shaped or Y-shaped pipe fittings 77 are provided along the liquid cooling circuit C1, in fluid communication with the piping 71, 73, to distribute water from both pumping modules 60 to all of the liquid cooling devices 50 and to distribute water from all of the liquid cooling devices 50 to both pumping modules 60. Furthermore, two pumping modules 60 fluidly connected adds a level of redundancy, notably since if one of the pumping module 60 has to stop working or to be removed for maintenance, the second pumping module 60 continues ensuring the flow of water in the liquid cooling circuit C1.

Similarly, while the air cooling circuit C2 has been described in respect of a single one of the pumping modules 60 for simplicity, it is to be understood that, in this embodiment, the air cooling circuit C2 is defined by the above-described components of the both pumping modules 60 and by both air-to-liquid heat exchangers 90. Notably, while each air-to-liquid heat exchanger 90 is fluidly connected to the plate heat exchangers 64 of the corresponding pumping module 60 (mounted to the same door 30), water in the portion of the air cooling circuit C2 defined by the plate heat exchangers 64 of both pumping modules 60 is merged in a same conduit to be routed to the external cooling equipment 75. Moreover, both air-to-liquid heat exchangers 60 are fluidly connected to the external cooling equipment 75 to receive cool water therefrom.

Liquid cooling of the electrical components of the UPS 10, via the liquid cooling devices 50 and the pumping modules 60, significantly dissipates the heat produced by the UPS 10. For instance, between 70% to 90% of the heat generating capacity of the UPS 10 can be dissipated by the liquid cooling provided by the liquid cooling devices 50. Consequently, the air cooling of the UPS 10 via the air-to-liquid heat exchangers 90 needs only dissipate a small proportion of the heat generating capacity of the UPS 10. This allows reducing the size of the air cooling system of the UPS 10 compared to conventional UPSs, thus optimizing the usage of space within the data center. Notably, conventional UPSs are typically cooled by forced air convection alone and therefore the air cooling system must be powerful and large enough to handle all of the heat generating capacity of the UPS. For instance, in some cases, conventional UPSs rely on an air handler disposed between UPSs for cooling thereof or a large computer room air conditioning (CRAC) unit to cool the room within which the UPSs are located.

Providing the pumping modules 60 and the air-to-liquid heat exchangers 90 on the doors 30 of the UPS 10 as described above can offer various advantages. Notably, the pumping modules 60 and its pumps 62 can be kept compact and locally accessible at the UPS 10 rather than having a large pumping system to circulate water to all of the UPSs of a data center. Moreover, the pumping modules 60 and the air-to-liquid heat exchangers 90 are easy to access which can facilitate their maintenance. For instance, the components of the pumping modules 60, including for example the pumps 62, as well as the air-to-liquid heat exchangers 90 can be removed from the UPS 10 from the exterior of the UPS 10. Similarly, the position of the fans 102 on the doors 30 allows easy access thereto. In addition, positioning the pumping modules 60 outside of the interior space 15 of the UPS 10 allows ensuring that any potential leaks at the pumping modules 60 will not adversely affect the components of the electrical system 40, thus ensuring the safety of the UPS 10 and the data center in general. Similarly, the position of the air-to-liquid heat exchangers 90 on the exterior sides of the doors 30 allows the connection between the external cooling equipment 75 and the UPS 10 to be outside of the UPS 10, thereby preventing any potential leaks at the connection to affect function of the UPS 10. This can facilitate the process of obtaining safety certification for the UPS 10 despite its implementation of a liquid cooling circuit that extends partly within the interior space 15.

Furthermore, as will be understood, placing the pumping modules 60 and the air-to-liquid heat exchangers 90 on the front side of the UPS 10, in particular on the exterior sides 36 of the doors 30, allows positioning two UPSs 10 side-by-side and thereby keep the surface area within the data center required to house and service the UPSs 10 relatively small. In addition, this manner of cooling the UPS 10 foregoes placing any equipment atop the UPS 10 (i.e., above the top wall 16 of the housing 12) which can allow the UPS 10 to be installed in facility with low ceilings as only a small clearance above the top wall 16 has to be accommodated for air to be aspirated into the interior space 15 through the top wall 16. In contrast, conventional UPSs often require placing an air handling unit laterally between two UPSs to circulate air therethrough, with the air handling unit occupying a significant amount of space. Moreover, conventional UPSs often require installing containment barriers above the UPSs to form "hot" and "cold" aisles to prevent hot air to be mixed with the cold air that is to be circulated through the UPSs. Besides using considerable space, this can present a challenge in terms of ceiling height as well as cable management for the UPSs. Furthermore, the hot and cold aisles formed by the containment barriers typically require implementing raised a floor and false ceiling to allow cooled air and hot air to circulate, which can be eliminated with the present technology In addition, the above-described configuration may facilitate retrofitting a conventional UPS to improve its cooling capacity and provide cooling autonomy thereto. Notably, a door assembly including the door 30 and the associated pumping module 60 and air-to-liquid heat exchanger 90 may be provided on its own to retrofit a conventional UPS. In particular, the target components of the conventional UPS that are intended to be cooled can be removed for mounting the liquid cooling devices 50 thereto (conventional heat sinks may have to be removed if applicable). Once the liquid cooling devices 50 are installed, the target components are reinstalled. The conventional door of the UPS is removed and replaced with the door assembly including the door 30 and the associated pumping module 60 and air-to-liquid heat exchanger 90 (the two doors may be replaced if desired). The piping is then connected to ensure the circuits C1, C2 are established.

The electrical power capacity of the UPS 10 may also be increased by the implementation of the cooling system as described above. Notably, the electrical power capacity of the UPS 10 may be increased by up to 10% by using the above-described cooling system, while using electrical components that are the same as those used in conventional UPSs. Indeed, a component that is watercooled has a lower operating temperature than the same component that is aircooled when its electrical capacity remains the same. Consequently it is also possible to increase the electrical capacity of a watercooled component while keeping its temperature below the temperature reached by this component when it is to be aircooled.

The autonomy gained by the UPS 10 by placing the pumping modules 60 and air to liquid heat exchangers 90 on the UPS 10 also provides more flexibility in placing the UPS 10 within the data center. Notably, the UPS 10 can be placed in a same room as server racks containing servers and need not be isolated in a dedicated "power room" as is often the case with conventional UPSs.

It should be noted that in some embodiments, only one pumping module 60 and one air-to-liquid heat exchanger 90 could be provided on one of the doors 30. However, the inclusion of two pumping modules 60 and two air-to-liquid heat exchangers 90 provides redundancy to the cooling system of the UPS 10 as one of the pumping modules 60 and/or one of the air-to-liquid heat exchangers 90 could be disabled or removed for maintenance while the other pumping module 60 and the other air-to-liquid heat exchanger 90 still ensures some degree of cooling of the UPS 10.

In some embodiments, the two pumping modules 60 may define two separate and independent liquid cooling circuits C1 (the T-shaped or Y-shaped pipe fittings 77 would be omitted), with a first liquid cooling circuit C1 feeding water to some (e.g., half) of the fluid conduits 125 of each liquid cooling device 50, and a second liquid cooling circuit C1 feeding water to the remaining (e.g., the other half) of the fluid conduits 125 of the liquid cooling devices 50. While this may not provide redundancy between the two pumping modules 60 as described above, if may provide redundancy at the local level of each liquid cooling device 50 as the fluid conduits 125 thereof are fed by two fluidly independent liquid cooling circuits.

The configuration and functioning of the liquid cooling devices 50 will now be described in greater detail with reference to FIGS. 17 to 22. Each liquid cooling device 50 is configured to cool a plurality of target components 115. In the illustrated example, the target components 115 are the semiconductors of any of the components of the electrical system 40 of the UPS 10. Notably, in this example of implementation, each cooling device 50 is configured to cool three semiconductors 115. The target components 115 may be any other suitable components that generate heat and could benefit from cooling. Since each liquid cooling device 50 is identical in this example, only one of the liquid cooling devices 50 will be described in detail herein. It is to be understood that the same description applies to the other liquid cooling devices 50.

As best shown in FIG. 20, the liquid cooling device 50 includes a base member 110 and a plurality of cover members 112 connected to the base member 110. As will be described in more detail below, the cover members 112 define, together with the base member 110, a plurality of fluid conduits 125. The fluid conduits 125 define part of the liquid cooling circuit C1. The fluid conduits 125 of the liquid cooling device 50 are independent from one another in that water flows through the fluid conduits 125 in parallel. As such, each fluid conduit 125 receives, at an inlet thereof, cool water that has not circulated through another one of the fluid conduits 125 (as would be the case if they were connected in series).

The base member 110 and the cover members 112 are made of copper so as to effectively conduct heat. Other thermally conductive materials are also contemplated.

Figure 17:
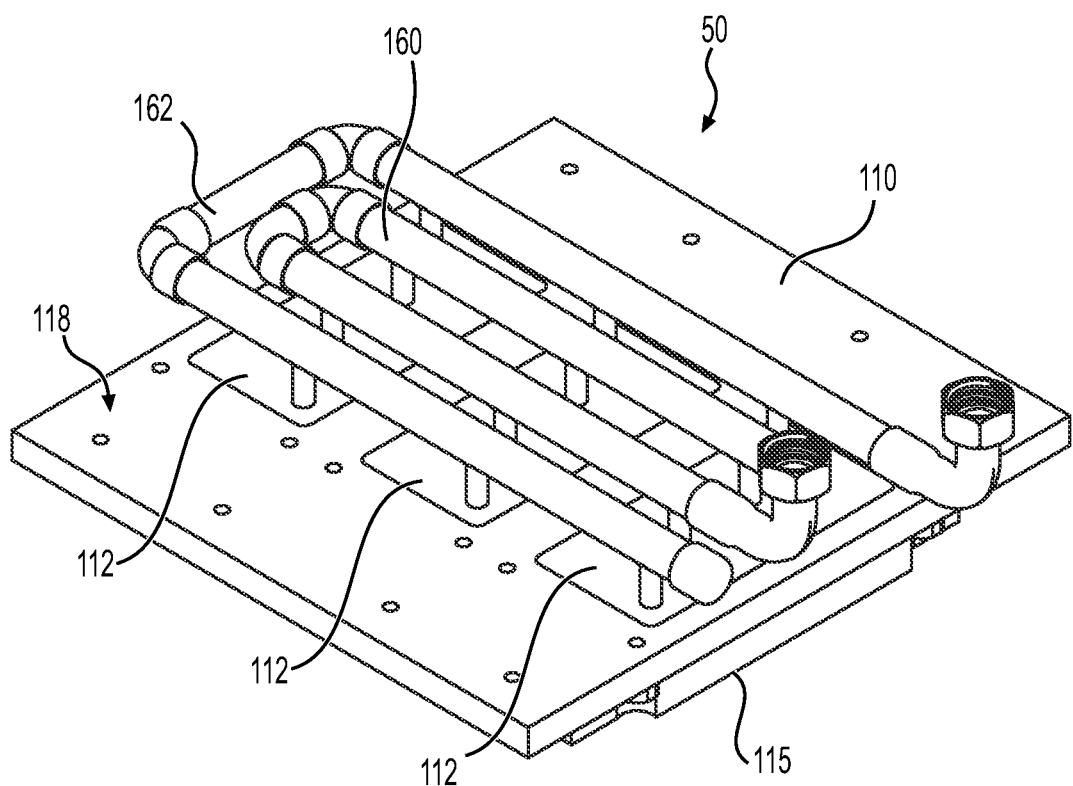
FIG. 17 is a perspective view of one of the liquid cooling devices of the UPS of FIG. 1.
Figure 18:
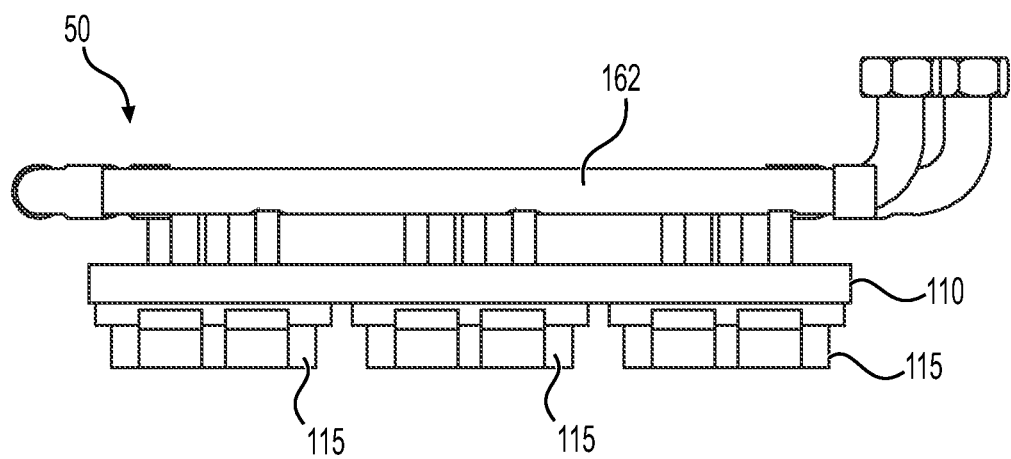
FIG. 18 is a front elevation view of the liquid cooling device of FIG. 17.

As shown in FIGS. 17 and 18, the base member 110 of the liquid cooling device 50 is in thermal contact with the three semiconductors 115 that are intended to be cooled by the liquid cooling device 50. More specifically, a lower surface 114 of the base member 110 (shown in FIG. 19), on a lower side 116 of the base member 110, is placed in contact with the semiconductors 115. The lower surface 114 is generally flat to ensure proper contact between the semiconductors 115 and the lower surface 114. A thermal paste may be disposed between the lower surface 114 and the semiconductors 115 to efficiently transmit heat from the semiconductors 115 to the base member 110. The base member 110 defines a plurality of fastener openings 113 configured to receive respective fasteners (not shown) to fasten the semiconductors 115 to the base member 110. The fastener openings 113 extend from the lower side 116 to an upper side 118 of the base member 110.

In this embodiment, the base member 110 is generally rectangular. The base member 110 is sized to span the three semiconductors 115. A thickness of the base member 110, which provides rigidity to the base member 110, is dependent on a surface area of the base member 110. In this embodiment, the thickness of the base member 110 is between 8 mm and 15 mm inclusively. More specifically, the thickness of the base member 110 is approximately 10 mm. It is desirable to provide the thinnest base member 110 while ensuring adequate rigidity thereof for the given surface area of the base member 110 since providing a thinner base member 110 reduces the costs of production of the liquid cooling device 50.

Figure 21:
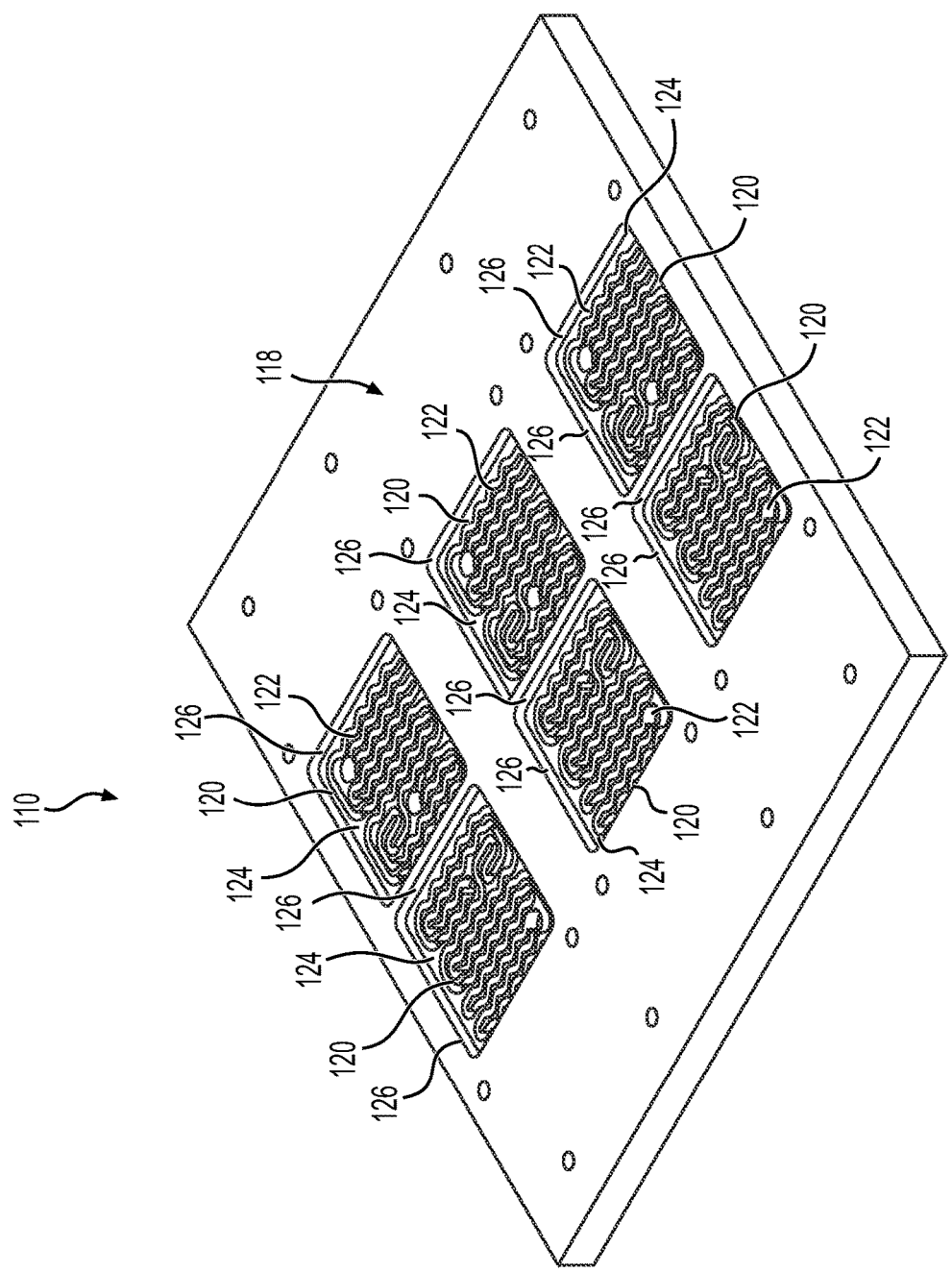
FIG. 21 is a perspective view of a base member of the liquid cooling device of FIG. 17.
Figure 22:
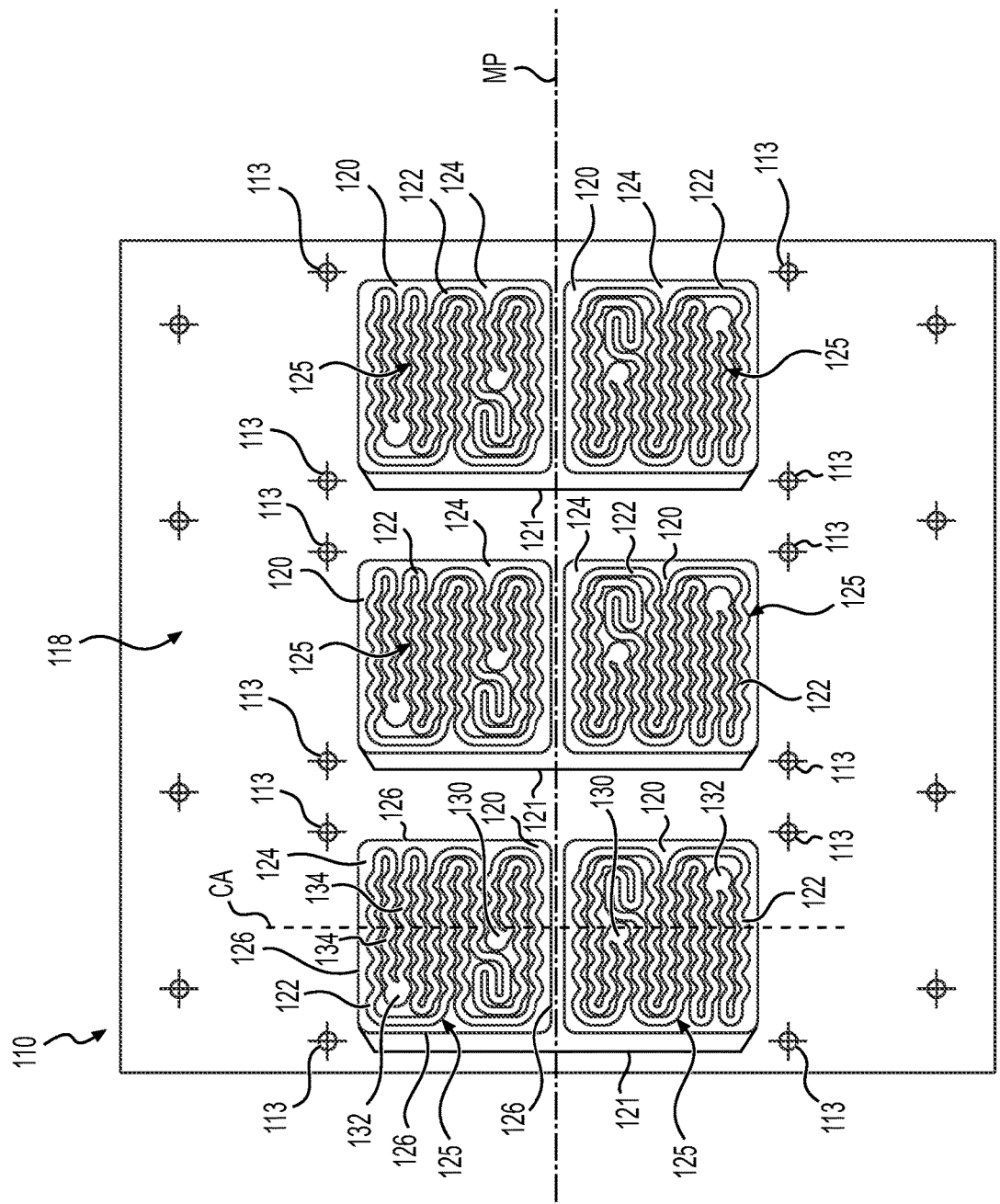
FIG. 22 is a top plan view of the base member of FIG. 21.

As shown in FIGS. 21 and 22, on its upper side 118 (opposite the lower side 116), the base member 110 defines a plurality of pockets 120 that are spaced apart from one another. The pockets 120 are generally rectangular, and in particular generally square, and receive therein respective ones of the cover members 112. Each pocket 120 is defined by a pocket upper surface 124 and side walls 126 (shown in FIG. 21).

In this embodiment, the number of pockets 120 defined by the base member 110 corresponds to the number of cover members 112 of the liquid cooling device 50. Notably, the base member 110 defines an even number of pockets 120, namely six pockets 120, to receive respective ones of the six cover members 112. It is contemplated that a different number of pockets 120 could be defined by the base member 110 in other embodiments (e.g., if fewer or more semiconductors are to be cooled by the liquid cooling device 50). For instance, in some embodiments, if a single semiconductor 115 is to be cooled by the liquid cooling device 50, the base member 110 may define only two pockets 120.

The pockets 120 are arranged so that, when the liquid cooling device 50 is mounted to the semiconductors 115, each of the three semiconductors 115 is at least partly overlapped by (i.e., disposed vertically above or below) a corresponding pair of the pockets 120. Each pair of pockets 120 overlapping a given semiconductor 115 will be referred to herein as a pocket pairing 121. In this embodiment, since the semiconductors 115 are arranged generally parallel to one another and spaced apart from one another, the pockets 120 are arranged in a rectangular array. More specifically, the three pocket pairings 121 are spaced apart along a lateral direction of the liquid cooling device 50 which is parallel to a middle plane MP of the base member 110. The distance between the pockets 120 of two adjacent pocket pairings 121 is greater than a distance between the pockets 120 of a given one of the pocket pairings 121. The middle plane MP, which is normal to the lower surface 114 (and the pocket surfaces 124), is disposed centrally between the two pockets 120 of each pocket pairing 121. In this embodiment, because the semiconductors 115 are centered relative to the base member 110, the middle plane MP bisects the base member 110. Notably, the location of the middle plane MP is defined by the location of the semiconductors 115 relative to the base member 110 as the semiconductors 115 are centered relative to the middle plane MP for efficient cooling of the semiconductors 115.

It is contemplated that, in some embodiments, a single pocket could be provided for each semiconductor 115 to be cooled. Notably, in such embodiments, the single pocket would be configured to receive one of the cover members 112 such that a number of the semiconductors 115 is equal to the number of cover members 112.

Figure 23:
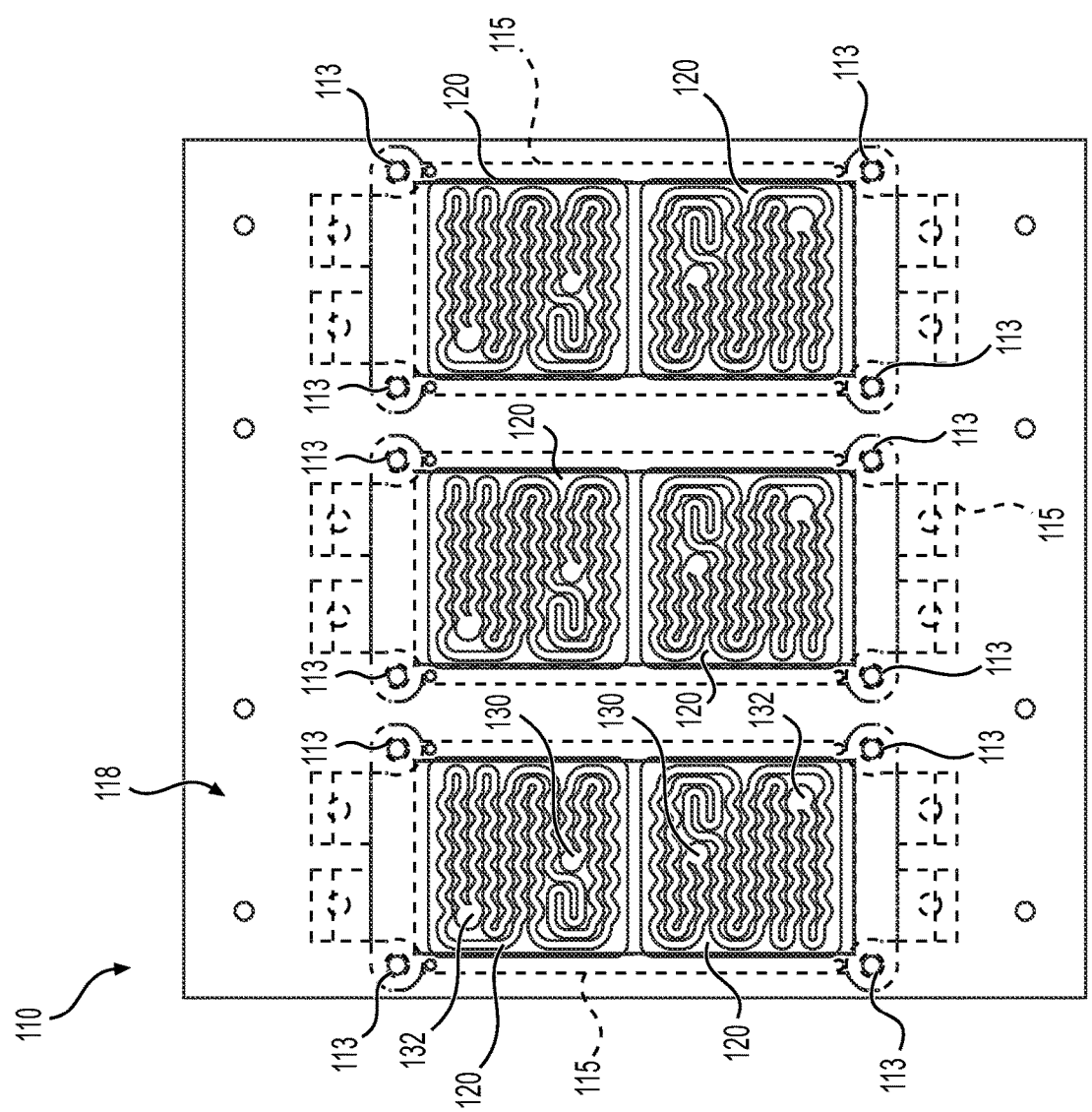
FIG. 23 is a top plan view of the base member of FIG. 21, shown with the underlying semiconductors in dashed lines.

With reference to FIG. 22, in order to form the fluid conduits 125, the base member 110 defines a plurality of fluid path recesses 122 on the upper side 118. The fluid path recesses 122 define the path of each fluid conduit 125 through which water in the liquid cooling circuit C1 flows to absorb heat from the semiconductors 115. Each of the pocket upper surfaces 124 defines one of the fluid path recesses 122 such that each fluid path recess 122 is disposed in a respective one of the pockets 120 and, as shown in FIG. 23, is aligned with a corresponding semiconductor 115. The base member 110 thus defines six fluid path recesses 122. In this embodiment, each fluid path recess 122 is shaped identically and thus only one of the fluid path recesses 122 in one of the pockets 120 will be described herein, with reference also being made to the fluid path recess 122 disposed in the other pocket 120 of the same pocket pairing 121.

The fluid path recess 122 has a circular inlet zone 130 and a circular outlet zone 132 which correspond to the points at which the fluid path recess 122 (and the corresponding fluid conduit 125) respectively receives and discharges water. At the inlet zone 130, the fluid path recess 122 splits into two separate channels 134 which merge together again at the outlet zone 132. Each of the channels 134 defines a sinusoidal pattern along a majority of a span thereof. That is, each one of the channels 134 has a repetitive pattern approximating that of a sinusoidal function along at least half of the span of that channel 134.

The inlet zone 130 of the fluid path recess 122 is located closer to the middle plane MP than the outlet zone 132 (i.e., a distance between the inlet zone 130 and the middle plane MP is smaller than a distance between the outlet zone 132 and the middle plane MP). In other words, water enters the fluid path recess 122 closer to the middle plane MP than it is discharged from the fluid path recess 122. Furthermore, the inlet zone 130 is generally centered between the side walls 126 (of the corresponding pocket 120) that extend perpendicularly to the middle plane MP. As such, a central axis CA extending centrally between the side walls 126 of the given pocket pairing 121 that extend perpendicularly to the middle plane MP extends through the inlet zones 130 of the fluid path recesses 122 in both pockets 120 of the given pocket pairing 121. Conversely, the outlet zone 132 is offset from the central axis CA and is thus closer to one of the side walls 126 that extend perpendicularly to the middle plane MP. The outlet zones 132 of the fluid path recesses in the pockets 120 of the same pocket pairing 121 are located on opposite sides of the central axis CA.

The positions of the inlet and outlet zones 130, 132 have been expressly chosen to have an optimal cooling effect on the corresponding semiconductor 115. Notably, because water flowing through the fluid path recess 122 is coldest as it enters at the inlet zones 130, the inlet zones 130 are positioned to be aligned with the regions of the corresponding semiconductor 115 that are subject to the highest temperatures during operation of the UPS 10. Moreover, as water flowing through the fluid path recess 122 is hottest as it is discharged at the outlet zones 132, the outlet zones 132 of the fluid path recesses 122 aligned with one of the semiconductors 115 are positioned specifically on opposite sides of the central axis CA. A thermal analysis of the implementation of these configurations of the fluid path recesses 122 has demonstrated to offer an optimal heat dissipation for each semiconductor 115.

The fluid path recesses 122 may be shaped differently in other embodiments, such as in embodiments in which components other than semiconductors are the target components that the liquid cooling device 50 is intended to cool.

In this embodiment, the channels 134 of the fluid path recesses 122 have a width of approximately 2 mm and a depth of approximately 4 mm. Notably, the fluid path recesses 122 are milled into the pocket upper surfaces 124. This can simplify and accelerate the production of the liquid cooling devices 50, notably as various base members 110 can be mounted to a computer numerically controlled (CNC) mill and the six fluid path recesses 122 of each base member 110 can be machined in a single operation.

Returning to FIG. 20, each cover member 112 is received in a corresponding one of the pockets 120 to define, together with the corresponding fluid path recess 122, a respective fluid conduit 125. The cover members 112 are planar plates which are shaped and sized to be congruous with the shape of the pockets 120. Notably, in this embodiment, the cover members 112 are generally square with rounded corners. Each cover member 112 has a lower side (not shown) and an upper side 140. A lower surface (not shown) of each cover member 112 is planar and faces the fluid path recess 122 of the corresponding pocket 120 to define the corresponding fluid conduit 125 together therewith. Each cover member 112 has a fluid inlet and a fluid outlet for receiving and discharging water through the corresponding fluid conduit 125 defined by that cover member 112. The fluid inlet and fluid outlet of the cover member 112 are defined by an inlet opening and an outlet opening respectively. An inlet tube 142 and an outlet tube 144 are connected to each cover member 112. In particular, the inlet tube 142 is welded to each cover member 112 and is fluidly connected to the corresponding inlet opening defined by the cover member 112. Similarly, the outlet tube 144 is welded to each cover member 112 and is fluidly connected to the corresponding outlet opening defined by the cover member 112. In this embodiment, the inlet tubes 142 and the outlet tubes 144 are welded to the cover members 112 via an autogenous welding process. Notably, the inlet tubes 142 and outlet tubes 144 are welded to the cover members 112 via laser welding (also referred to as "laser beam welding"). Namely, as will be described in more detail below, autogenous welding processes such as laser welding offer advantages in terms of quality which is particularly important to ensure safety in the context of feeding a liquid into the interior space 15 of the UPS 10 which has many electrical components that could be negatively affected by a leak.

When the cover members 112 are in position in the corresponding pockets 120, the fluid inlet and the fluid outlet of each cover member 112 are respectively aligned with the inlet zone 130 and the outlet zone 132 of the fluid path recess 122 disposed in the corresponding pocket 120.

As can be seen in FIG. 20, the cover members 112 are relatively thin. Notably, a thickness of each cover member 112 is between 2 mm and 5 mm inclusively. In particular, in this embodiment, the thickness of each cover member 112 is approximately 3 mm. This thinness of the cover members 112 allows using a small amount of material for their manufacture which makes the liquid cooling device 50 more affordable to produce. This is particularly advantageous considering that many liquid cooling devices 50 are included in the UPS 10.

This thinness of the cover members 112 poses a challenge in terms of connecting the cover members 112 to the base member 110. Notably, in order to reduce a number of parts of the liquid cooling device 50, it is desirable to weld the cover members 112 to the base member 110 since fastening the cover members 112 to the base member 110 via fasteners (e.g., screws, bolts, rivets, etc.) would require adding sealing members (e.g., gaskets) to prevent leaks. However, because the cover members 112 and the base member 110 are thin, welding the cover could potentially warp the material of the cover members 112 which could result in leaks during use of the liquid cooling device 50. To address this, the cover members 112 have a relatively small periphery such that each cover member 112 can be quickly welded along its periphery to the side walls 126 of the corresponding pocket 120. Notably, at least partly for this reason, the liquid cooling device 50 is designed such that each semiconductor 115 is cooled by two fluid conduits 125 defined by two small separate cover members 112 rather than a larger cover member spanning an equivalent surface area. This limits the amount of heat that is absorbed by the cover members 112 during welding thereof. Moreover, a pause time between welding each cover member 112 consecutively allows the base member 110 to cool which can prevent it from warping. Furthermore, in this embodiment, the cover members 112 are connected to the base member 110 by an autogenous welding process. That is, the cover members 112 are welded to the base member 110 without adding material to form the welds. This is contrast with non-autogenous welding processes in which a filler metal is added to join components. In particular, in this embodiment, the cover members 112 are connected to the base member 110 by laser welding (similarly to the outlet and inlet tubes 142, 144 described above). This ensures that the liquid cooling device 50 is properly sealed as the welds connecting the cover members 112 to the base member 110 are made of the same material as the cover members 112 and the base member 110 rather than relying on the quality of a filler metal. Moreover, with laser welding, the welds are not as susceptible to the presence of contaminants and the quality of the welds does not depend on the manner in which the welding material flows as is the case with non-autogenous welding processes.

As can be seen, the cover members 112 (and the corresponding pockets 120) are relatively small in size. Notably, in this embodiment, each cover member 112 and each pocket 120 extends along a surface area of approximately 20 cm². As such, the periphery of the cover members 112 is relatively small which allows welding the cover members 112 without exposing the cover members 112 or the base member 110 to excessive heat during assembly which could result in the liquid cooling device 50 being defective as described above.

Figure 24:
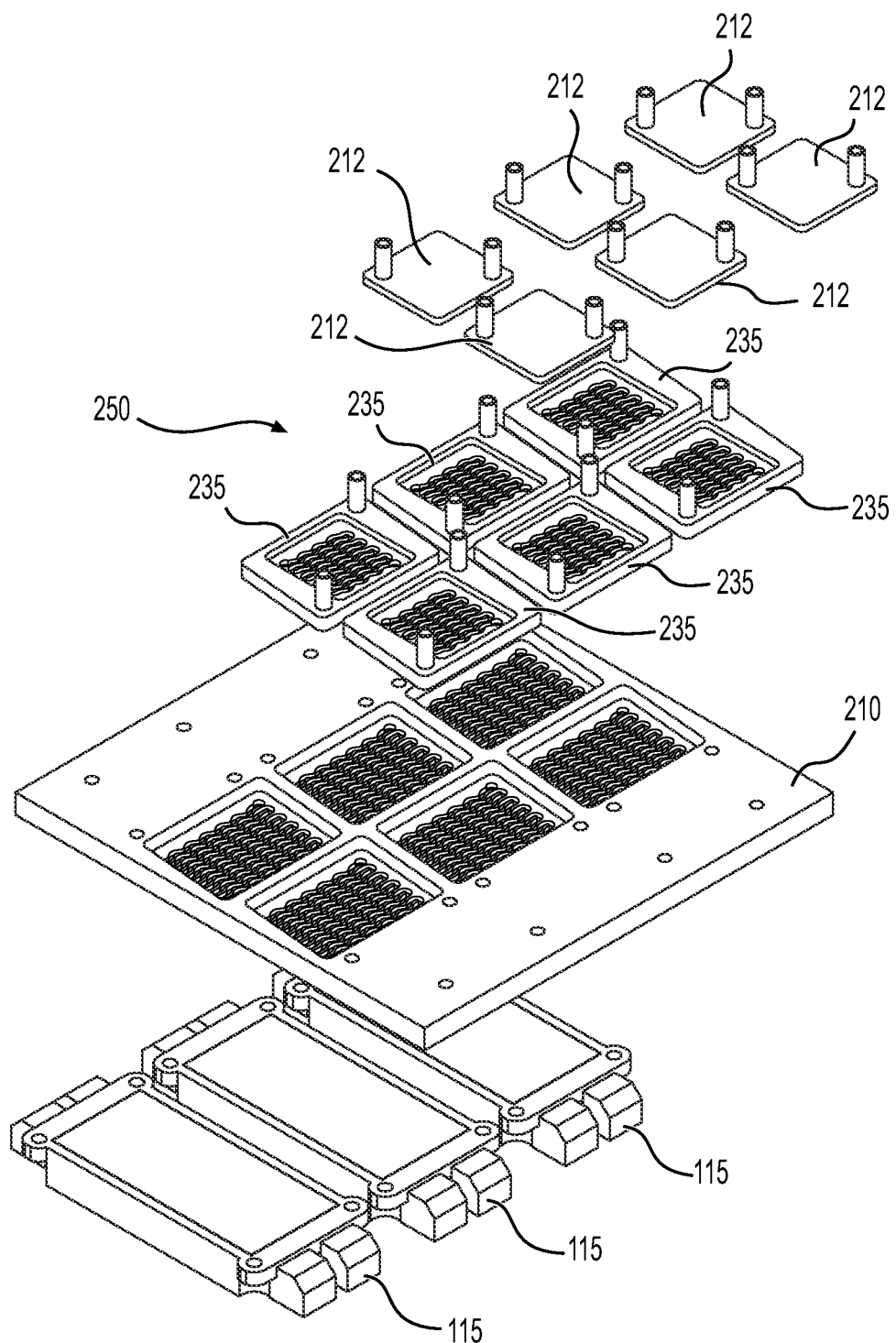
FIG. 24 is an exploded view of a liquid cooling device according to an alternative embodiment.

In an alternative embodiment, with reference to FIG. 24, a liquid cooling device 250 could be provided instead of the liquid cooling device 50. The liquid cooling device 250 includes a base member 210, a plurality of cover members 212 and a plurality of intermediate members 235 which are connected to one another. The base member 210 is similar to the base member 110 described above and the cover members 212 are similar to the cover members 112 described above and therefore they will not be described in detail herein. Each intermediate member 235 is received in a corresponding pocket of the base member 210. Each cover member 212 is stacked atop one of the intermediate members 235. The addition of the intermediate members 235 allows defining, for each pocket defined by the base member 210, two separate fluid conduits that are fluidly connected in parallel (not in series) to provide redundancy in case one of the fluid conduits should be disabled (e.g., blocked). Notably, for each pocket of the base member 210, a lower fluid conduit is defined between the base member 210 and the corresponding intermediate member 235, and an upper fluid conduit is defined between the intermediate member 235 and the corresponding cover member 212. Each intermediate member 235 defines a fluid inlet and a fluid outlet to receive fluid into and discharge fluid from the lower fluid conduit. A liquid cooling device having upper and lower fluid conduits of this type is described in greater detail in European Patent Application No. 18315027.5, filed on Sep. 4, 2018, the entirety of which is incorporated herein by reference. In some embodiments in which the UPS 10 is equipped with the liquid cooling devices 250, the two pumping modules 60 may define two separate and independent liquid cooling circuits C1 (the T-shaped or Y-shaped pipe fittings 77 would be omitted), with a first liquid cooling circuit C1 feeding water to some lower (or upper) fluid conduits of some liquid cooling devices 250, and a second liquid cooling circuit C1 feeding water to the corresponding upper (or lower) fluid conduits of these liquid cooling devices 250.

Returning now to FIGS. 17, 18 and 20, the liquid cooling device 50 also includes an inlet manifold 160 fluidly connected to the fluid inlets of the cover members 112 via the inlet tubes 142, and an outlet manifold 162 fluidly connected to the fluid outlets of the cover members 112 via the outlet tubes 144. The inlet and outlet manifolds 160, 162 are disposed exteriorly of the base member 110, in particular being disposed above the base member 110. The inlet manifold 160 is configured for feeding water to the fluid conduits 125. Notably, the inlet manifold 160 receives cooled water from the plate heat exchangers 64 of the pumping modules 60. The outlet manifold 162 is configured for discharging water from the fluid conduits 125. In particular, heated water discharged through the fluid outlets of the cover members 112 flows through the outlet manifold 162 and is routed back towards the pumps 62 of the pumping modules 60 and cooled again at the plate heat exchangers 64.

In this embodiment, the inlet manifold 160 and outlet manifold 162 are fluidly connected to each fluid conduit 125 in a manner so as to establish a Tichelmann loop (sometimes written "Tickelman") through the liquid cooling device 50. More specifically, a distance between the inlet manifold 160 and the outlet manifold 162 through each fluid conduit 125 is approximately the same. This balances the fluid flow rates though the fluid conduits 125 of the liquid cooling device 50 so that they are approximately the same, which avoids having to implement valves to achieve similar flow rates through the fluid conduits 125.

The above-described configuration of the liquid cooling devices 50 is simple and cost-efficient to manufacture while ensuring an optimized cooling of the semiconductors 115. Notably, the various separate fluid conduits 125 in each liquid cooling device 50 ensures that heat is dissipated from a majority and even an entirety of an upper surface of each semiconductor 115. In particular, the base member 110 is in contact with the entire upper surface of each semiconductor 115 including a central portion thereof. This may not be the case for instance if each semiconductor 115 were instead cooled by two smaller separate liquid cooling devices (each defining a corresponding fluid conduit). Namely, the central portion of the semiconductor 115 would not be in contact with either of the liquid cooling devices in such a case, thereby decreasing the efficiency of heat dissipation of the semiconductor 15. Moreover, the size of the base member 110 as to span various semiconductors 115 facilitates the positioning of the liquid cooling devices 50 in the UPS 10. In addition, as discussed above, manufacturing of the liquid cooling devices 50 by machining the base members 110 and welding of the cover members 112 is greatly simplified while ensuring that the liquid cooling device 50 is safe to use in an electrically powered environment.

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. An uninterruptible power supply (UPS) comprising:
a housing defining an interior space;
a door operatively connected to the housing, the door being configured to be selectively opened and closed for accessing the interior space of the housing;
an electrical system enclosed within the housing;
at least one liquid cooling device mounted to a target component of the electrical system disposed within the housing for cooling thereof, the at least one liquid cooling device defining a fluid conduit for circulating a first fluid therethrough;
a pumping module comprising at least one pump fluidly connected to the at least one liquid cooling device for circulating the first fluid therethrough, each of the at least one pump and the fluid conduit of the at least one liquid cooling device defining in part a liquid cooling circuit (C1), the pumping module being mounted to the door and disposed on an exterior side thereof; and
an air-to-liquid heat exchanger configured for cooling air flowing therethrough, the air-to-liquid heat exchanger being mounted to the door on the exterior side thereof, the air-to-liquid heat exchanger comprising:
a cooling coil for circulating a second fluid therethrough; and
a plurality of fins in thermal contact with the cooling coil;
wherein any fluid exchange between the first fluid and the second fluid is prevented.

2. The UPS of claim 1, wherein:
the door defines at least one opening;
the air-to-liquid heat exchanger is at least partially aligned with the at least one opening; and
the UPS further comprises at least one fan contained within the housing when the door is closed, the at least one fan being configured to force the air to flow through the at least one opening of the door and through the air-to-liquid heat exchanger.

3. The UPS of claim 2, wherein the at least one fan is mounted to the door on an interior side thereof.

4. The UPS of claim 2, wherein:
the door is a first door;
the air-to-liquid heat exchanger is a first air-to-liquid heat exchanger;
the at least one fan is at least one first fan;
the pumping module is a first pumping module; and
the UPS further comprises:

a second door operatively connected to the housing, the second door being configured to be selectively opened and closed for accessing the interior space of the housing, the second door defining at least one opening;

a second pumping module comprising at least one pump fluidly connected to the at least one liquid cooling device for circulating the first fluid through the liquid cooling circuit, the second pumping module being mounted to the second door and disposed on an exterior side thereof;

a second air-to-liquid heat exchanger mounted to the second door on the exterior side thereof, the second air-to-liquid heat being configured for cooling the air flowing therethrough, the second air-to-liquid heat exchanger being at least partially aligned with the at least one opening of the second door, the second air-to-liquid heat exchanger comprising:
   a cooling coil for circulating the second fluid therethrough; and
   a plurality of fins in thermal contact with the cooling coil of the second air-to-liquid heat exchanger; and
   at least one second fan contained within the housing when the second door is closed, the at least one second fan being configured to force the air to flow through the at least one opening of the second door and through the second air-to-liquid heat exchanger.

5. The UPS of claim 1, wherein the air-to-liquid heat exchanger is disposed vertically higher than the pumping module.

6. The UPS of claim 1, wherein the housing includes a top wall defining a top opening for air to be pulled into the interior space of the housing through the top opening.

7. The UPS of claim 1, wherein the housing includes a bottom wall defining a bottom opening for air to be pulled into the interior space of the housing through the bottom opening.

8. The UPS of claim 1, wherein:
the electrical system comprises:
   a rectifier module configured to be electrically connected to at least one battery for charging thereof; and
   an inverter module electrically connected to the at least one battery for supplying electrical power from the at least one battery to a target load; and
the target component is a component of the electrical system of the UPS.

9. The UPS of claim 8, wherein:
at least one of the inverter module and the rectifier module comprises the target component, the target component including a plurality of semiconductors; and
the at least one liquid cooling device is mounted to at least one of the semiconductors.

10. The UPS of claim 1, wherein:
the air-to-liquid heat exchanger comprises at least one plate heat exchanger defining in part an air-cooling circuit (C2);
the second fluid is circulating in the air cooling circuit; and
the at least one plate heat exchanger prevents any fluid exchange between the first and second fluids.

11. The UPS of claim 10, wherein the at least one plate heat exchanger comprises:
a first inlet and a first outlet being part of the liquid cooling circuit;
a set of first plates fluidly connected to the first inlet and to the first outlet, the set of first plates being configured to absorb heat from the first fluid flowing between the first inlet and the first outlet;
a second inlet and a second outlet being part of the air cooling circuit; and
a set of second plates fluidly connected to the second inlet and to the second outlet, the set of second plates being configured to receive a transfer of the heat absorbed by the set of first plates and to transfer further the heat to the second fluid flowing between the second inlet and the second outlet.

12. An uninterruptible power supply (UPS) comprising:
a housing defining an interior space;
a door operatively connected to the housing, the door being configured to be selectively opened and closed for accessing the interior space of the housing;
an electrical system enclosed within the housing;
at least one liquid cooling device mounted to a target component of the electrical system disposed within the housing for cooling thereof, the at least one liquid cooling device defining a fluid conduit for circulating a first fluid therethrough; and
a pumping module comprising at least one pump fluidly connected to the at least one liquid cooling device for circulating the first fluid therethrough, each of the at least one pump and the fluid conduit of the at least one liquid cooling device defining in part a liquid cooling circuit (C1), the pumping module being mounted to the door and disposed on an exterior side thereof
wherein the pumping module further comprises at least one plate heat exchanger defining part of the liquid cooling circuit, the at least one plate heat exchanger being fluidly connected to the at least one pump and to the at least one liquid cooling device; and
wherein the first fluid cooled in the liquid cooling circuit by the at least one plate heat exchanger is routed to the at least one liquid cooling device.

13. The UPS of claim 12, wherein:
the door defines at least one opening; and
the UPS further comprises an air-to-liquid heat exchanger configured for cooling air flowing therethrough, the air-to-liquid heat exchanger being mounted to the door on the exterior side thereof and being at least partially aligned with the at least one opening, the air-to-liquid heat exchanger comprising:
   a cooling coil for circulating a second fluid therethrough, the cooling coil defining part of an air cooling circuit (C2); and
   a plurality of fins in thermal contact with the cooling coil;
wherein the at least one plate heat exchanger of the pumping module defines a part of the air cooling circuit so that heat can be transferred between the first fluid in the liquid cooling circuit and the second fluid in the air cooling circuit at the at least one plate heat exchanger.

14. The UPS of claim 13, wherein:
the cooling coil of the air-to-liquid heat exchanger is configured to be connected to an external cooling equipment such that the air cooling circuit is defined at least in part externally of the UPS; and
the liquid cooling circuit is defined entirely locally at the UPS.

15. A door assembly for an uninterruptible power supply (UPS), the UPS including a housing defining an interior space, the door assembly comprising:

a door having an interior side and an exterior side, the door being configured to be operatively connected to the housing of the UPS such that the door can be selectively opened and closed for accessing the interior space of the housing;

a pumping module comprising at least one pump configured to be fluidly connected to at least one liquid cooling device of the UPS disposed in the interior space for circulating a first fluid therethrough, the pumping module being mounted to the door and disposed on the exterior side thereof; and an air-to-liquid heat exchanger configured for cooling air flowing therethrough, the air-to-liquid heat exchanger being mounted to the door on the exterior side thereof, the air-to-liquid heat exchanger comprising:

a cooling coil for circulating a second fluid therethrough; and a plurality of fins in thermal contact with the cooling coil;

wherein any fluid exchange between the first fluid and the second fluid is prevented.

16. The door assembly of claim 15, wherein:
the door defines at least one opening; and
the air-to-liquid heat exchanger is at least partially aligned with the at least one opening.

17. The door assembly of claim 16, further comprising at least one fan mounted to the door on the interior side thereof, the at least one fan being configured to force the air to flow through the at least one opening of the door and through the air-to-liquid heat exchanger.

* * * * *

UNITED STATES PATENT AND TRADEMARK OFFICE
CERTIFICATE OF CORRECTION

PATENT NO. : 11,612,077 B2
APPLICATION NO. : 17/308181
DATED : March 21, 2023
INVENTOR(S) : Ali Chehade et al.

It is certified that error appears in the above-identified patent and that said Letters Patent is hereby corrected as shown below:

In the Claims

Column 22, Claim 12, Line 30, should read --door and disposed on an exterior side thereof;--

Signed and Sealed this
Fourth Day of July, 2023

Katherine Kelly Vidal
*Director of the United States Patent and Trademark Office*